US012183640B2

(12) United States Patent
More

(10) Patent No.: US 12,183,640 B2
(45) Date of Patent: Dec. 31, 2024

(54) SEMICONDUCTOR DEVICE AND METHODS OF FORMATION

(71) Applicant: Taiwan Semiconductor Manufacturing Company, Ltd., Hsinchu (TW)

(72) Inventor: Shahaji B. More, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 395 days.

(21) Appl. No.: 17/650,600

(22) Filed: Feb. 10, 2022

(65) Prior Publication Data

US 2023/0253258 A1 Aug. 10, 2023

(51) Int. Cl.
*H01L 21/00* (2006.01)
*H01L 21/02* (2006.01)
(Continued)

(52) U.S. Cl.
CPC ............ *H01L 21/823814* (2013.01); *H01L 21/02532* (2013.01); *H01L 21/0259* (2013.01); *H01L 21/0262* (2013.01); *H01L 21/02645* (2013.01); *H01L 21/823807* (2013.01); *H01L 21/823878* (2013.01); *H01L 27/092* (2013.01); *H01L 29/0665* (2013.01); *H01L 29/42392* (2013.01); *H01L 29/66545* (2013.01);
(Continued)

(58) Field of Classification Search
CPC ....... H01L 21/823814; H01L 21/02532; H01L 21/0259; H01L 21/0262; H01L 21/02645; H01L 21/21-823807; H01L 21/823878; H01L 27/092; H01L 29/0665; H01L 29/42392; H01L 29/66545; H01L 29/66553; H01L 29/66742; H01L 29/78618; H01L 29/78696
See application file for complete search history.

(56) References Cited

U.S. PATENT DOCUMENTS 11,430,892 B2 8/2022 Chiang et al.
2015/0243659 A1* 8/2015 Huang ................ H01L 29/7848
438/283
(Continued)

FOREIGN PATENT DOCUMENTS

TW 202111947 A 3/2021

*Primary Examiner* — Richard A Booth
(74) *Attorney, Agent, or Firm* — Harrity & Harrity, LLP

(57) ABSTRACT

A cladding sidewall layer footing is removed prior to formation of a hybrid fin structure. Removal of the cladding sidewall layer footing prevents a metal gate footing from forming under the hybrid fin structure when the cladding sidewall layer is removed to enable the metal gate to be formed around the nanostructure channels of a nanostructure transistor. Cladding sidewall layers can be formed in an asymmetric manner to include different lengths and/or angles, among other examples. The asymmetric cladding sidewall layers enable asymmetric metal gate structures to be formed for p-type and n-type nanostructure transistors while preventing metal gate footings from forming under hybrid fin structures for p-type and n-type nanostructure transistors. This may reduce a likelihood of short channel effects and leakage within the nanostructure transistors yield of nanostructure transistors formed on a semiconductor substrate.

20 Claims, 28 Drawing Sheets

(51) Int. Cl.
*H01L 21/8238* (2006.01)
*H01L 27/092* (2006.01)
*H01L 29/06* (2006.01)
*H01L 29/423* (2006.01)
*H01L 29/66* (2006.01)
*H01L 29/786* (2006.01)

(52) U.S. Cl.
CPC .. *H01L 29/66553* (2013.01); *H01L 29/66742* (2013.01); *H01L 29/78618* (2013.01); *H01L 29/78696* (2013.01)

(56) References Cited

U.S. PATENT DOCUMENTS

| | | | |
|---|---|---|---|
| 2020/0135923 A1* | 4/2020 | Wang | H01L 29/7843 |
| 2021/0376113 A1 | 12/2021 | Kao et al. | |
| 2023/0124549 A1* | 4/2023 | Chang | H01L 21/823481 |
| | | | 257/288 |
| 2023/0411493 A1* | 12/2023 | Lin | H01L 21/823468 |

\* cited by examiner

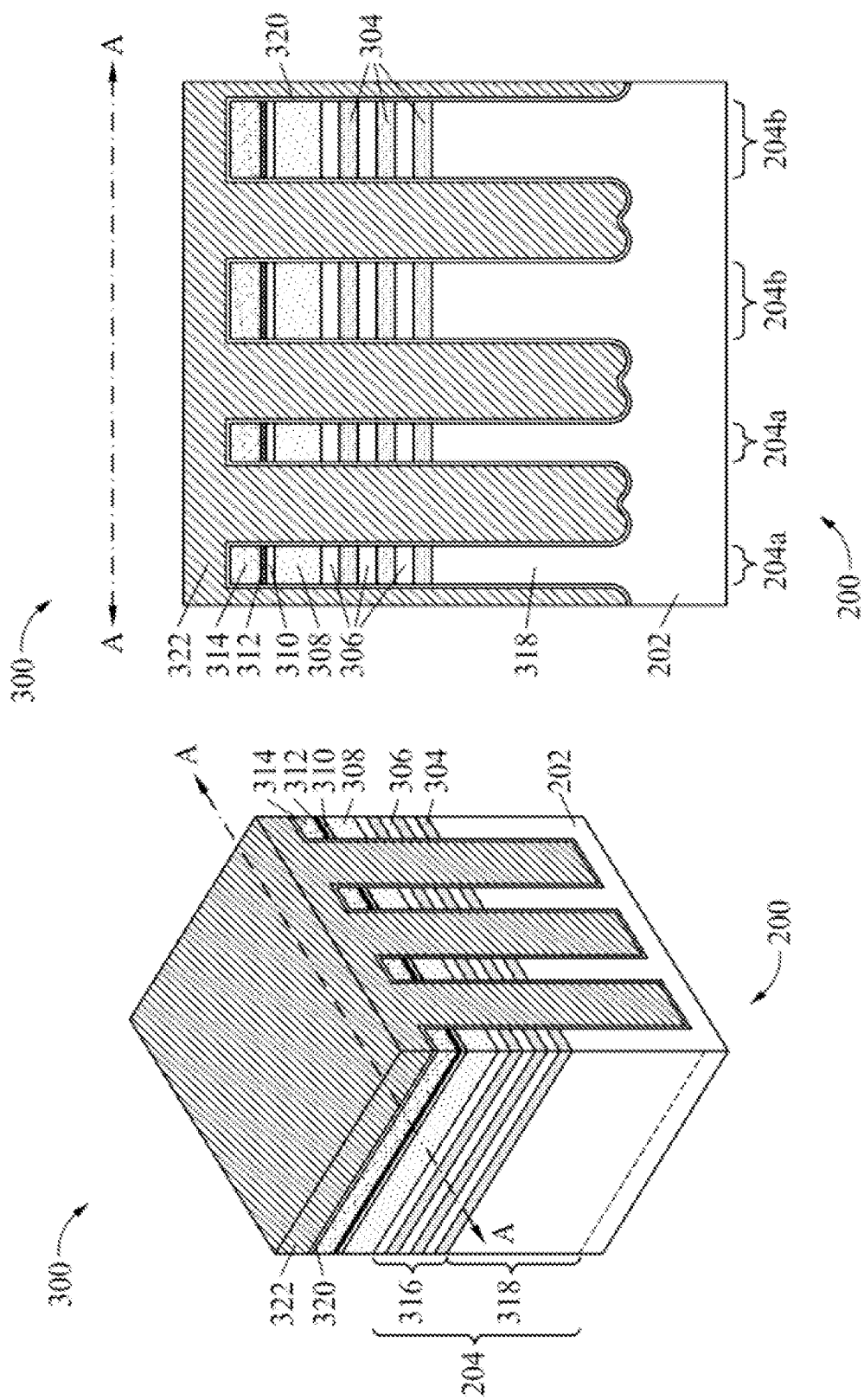

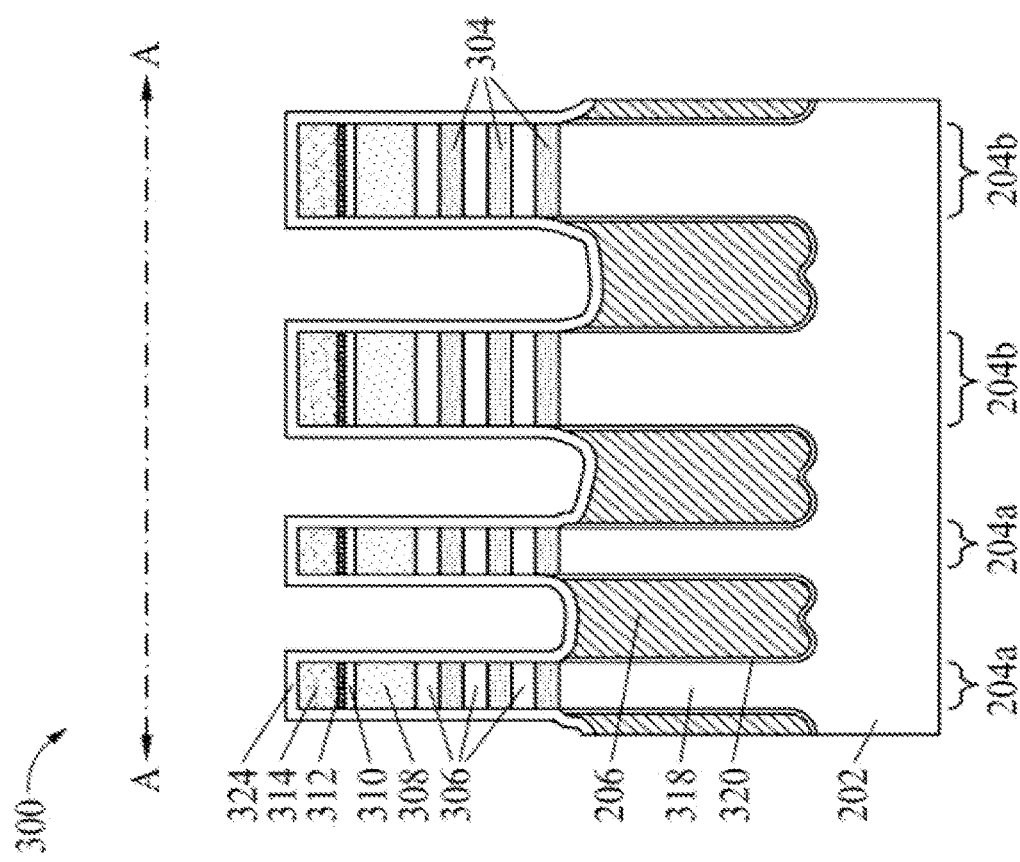
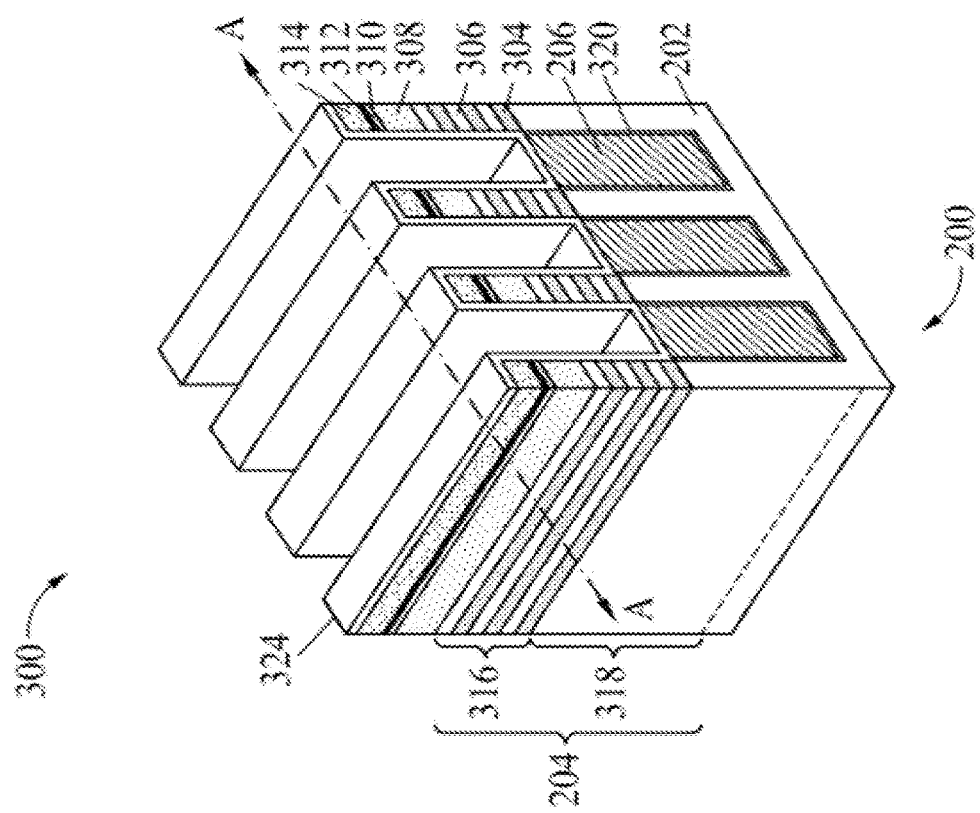
FIG. 3J
FIG. 3I

SEMICONDUCTOR DEVICE AND METHODS OF FORMATION

BACKGROUND

As semiconductor device manufacturing advances and technology processing nodes decrease in size, transistors may become affected by short channel effects (SCEs) such as hot carrier degradation, barrier lowering, and quantum confinement, among other examples. In addition, as the gate length of a transistor is reduced for smaller technology nodes, source/drain (S/D) electron tunneling increases, which increases the off current for a transistor (the current that flows through the channel of the transistor when the transistor is in an off configuration). Silicon (Si)/silicon germanium (SiGe) nanostructure transistors such as nanowires, nanosheets, and gate-all-around (GAA) devices are potential candidates to overcome short channel effects at smaller technology nodes. Nanostructure transistors are efficient structures that may experience reduced SCEs and enhanced carrier mobility relative to other types of transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
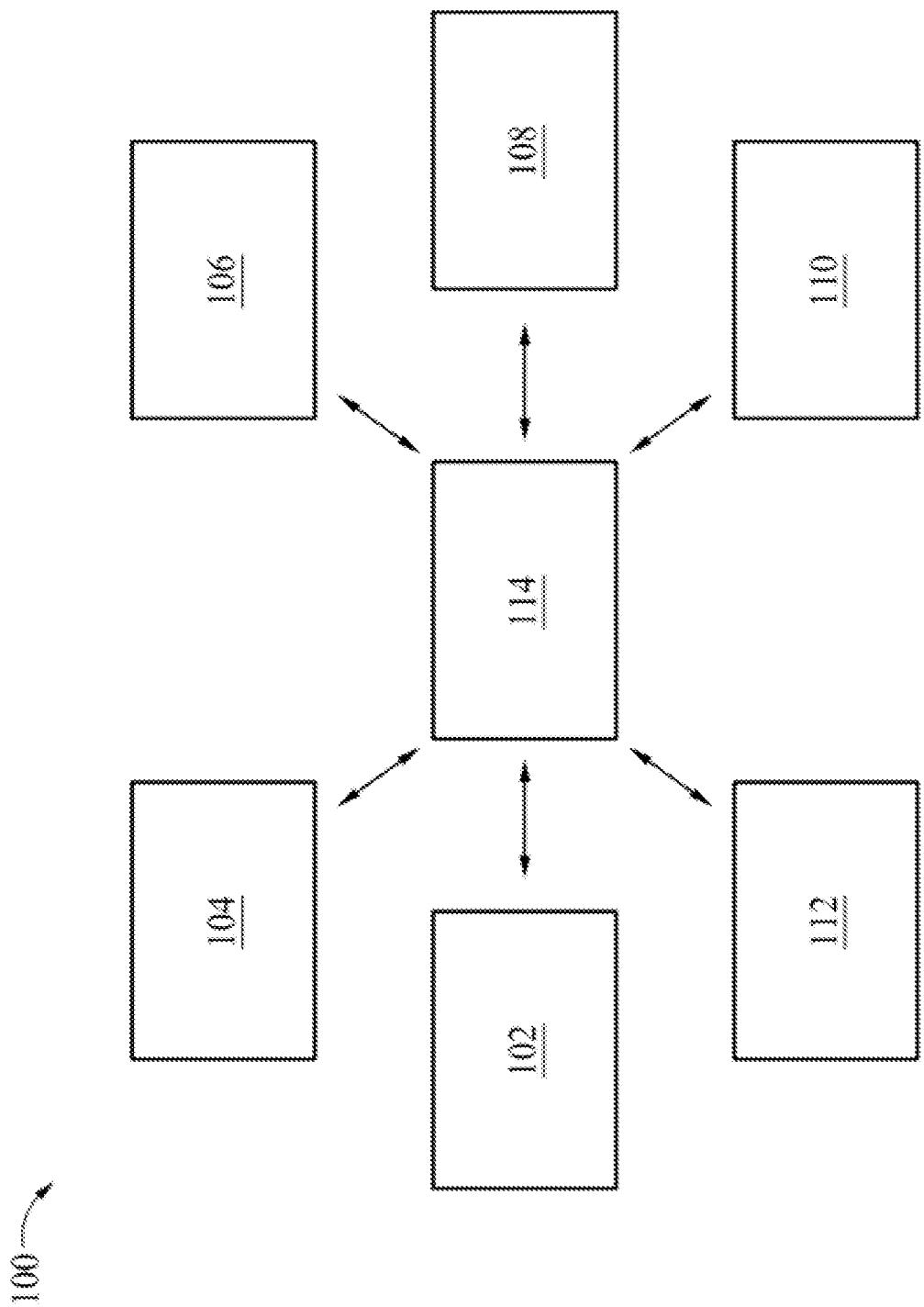
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, reducing geometric and dimensional properties of a fin field-effect transistor (finFET) may decrease a performance of the finFET. As an example, a likelihood of short channel effects such as drain-induced barrier lowering in a finFET may increase as finFET technology processing nodes decrease. Additionally or alternatively, a likelihood of electron tunneling and leakage in a finFET may increase as a gate length of the finFET decreases.

Nanostructure transistors (e.g., nanowire transistors, nanosheet transistors, gate-all-around (GAA) transistors, multi-bridge channel transistors, nanoribbon transistors, and/or other types of nanostructure transistors) may overcome one or more of the above-described drawbacks of finFETs. However, nanostructure transistors face fabrication challenges that can cause performance issues and/or device failures. For example, a cladding sidewall layer may be formed in a nanostructure transistor as a temporary structure to enable the formation of a metal gate (MG) that surrounds the nanostructure channels of the nanostructure transistor. Methods of forming the cladding sidewall layer may result in protrusions (e.g., an overhang of the cladding sidewall layer on a hard mask region of the nanostructure transistor and/or a footing of the cladding sidewall layer on a shallow trench isolation (STI) region of the nanostructure transistor under an adjacent hybrid fin structure, among other examples). As a result, when the cladding sidewall layer is removed so that the metal gate can be formed in the area that was occupied by the cladding sidewall layer, a footing of the metal gate also protrudes under the adjacent hybrid fin structure, which may cause electrical shorting between the metal gate and a source/drain contact (MD) of the nanostructure transistor. An electrical short between the metal gate and the source/drain contact may result in a failure of the nanostructure transistor and reduced yield of nanostructure transistors formed on a semiconductor substrate.

Some implementations described herein provide nanostructure transistors and methods of formation such that a cladding sidewall layer footing is removed prior to formation of a hybrid fin structure. Removal of the cladding sidewall layer footing prevents a metal gate footing from forming under the hybrid fin structure when the cladding sidewall layer is removed to enable the metal gate to be formed around the nanostructure channels of a nanostructure transistor. As described herein, cladding sidewall layers can be formed in an asymmetric manner to include different lengths and/or angles, among other examples. The asymmetric cladding sidewall layers enable metal gate structures to be formed for p-type and n-type nanostructure transistors while preventing metal gate footings from forming under hybrid fin structures for p-type and n-type nanostructure transistors. This may reduce a likelihood of short channel effects and leakage within the nanostructure transistors yield of nanostructure transistors formed on a semiconductor substrate.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
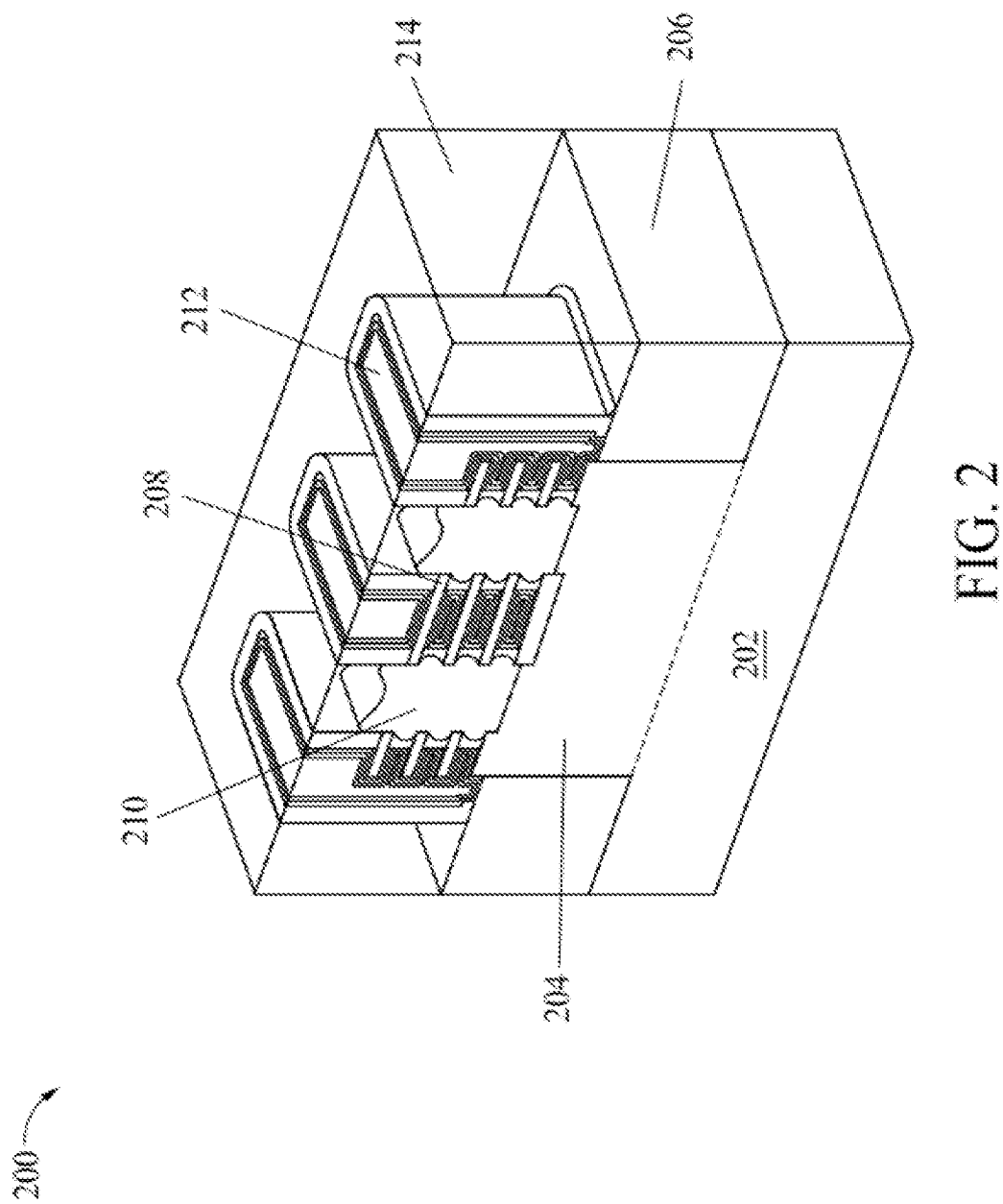
FIG. 2 is a diagram of an example semiconductor device described herein.
Figures 3A, 3B:
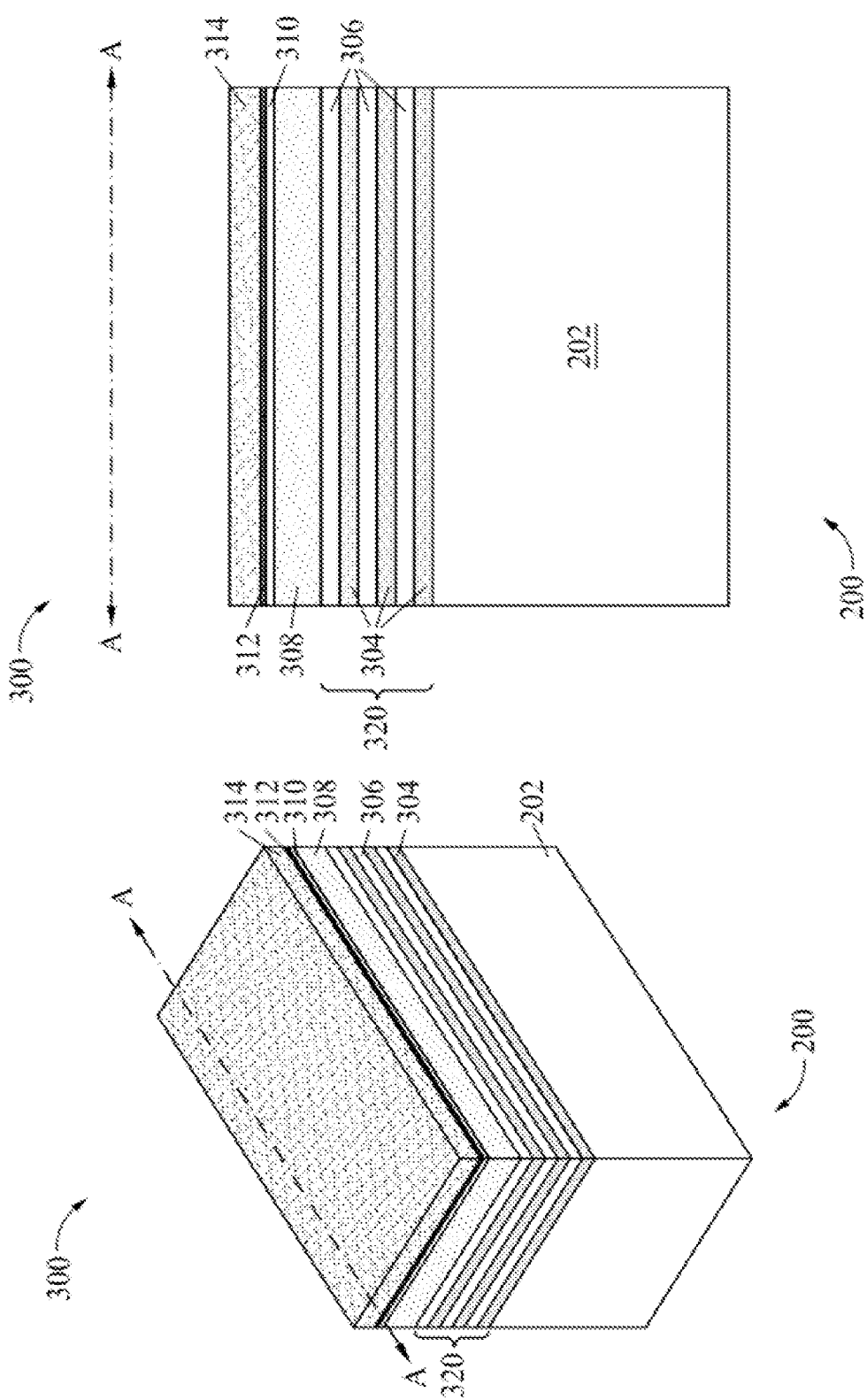
FIGS. 3A-3U, 4A-4D, 5A-5D, 6, 7A, 7B, 8, and 9 are diagrams of example implementations described herein.

FIG. 2 is a diagram of an example semiconductor device 200 described herein. The semiconductor device 200 includes one or more transistors. The one or more transistors may include nanostructure transistor(s) such as nanowire transistors, nanosheet transistors, gate-all-around (GAA) transistors, multi-bridge channel transistors, nanoribbon transistors, and/or other types of nanostructure transistors. The semiconductor device 200 may include one or more additional devices, structures, and/or layers not shown in FIG. 2. For example, the semiconductor device 200 may include additional layers and/or dies formed on layers above and/or below the portion of the semiconductor device 200 shown in FIG. 2. Additionally, or alternatively, one or more additional semiconductor structures and/or semiconductor devices may be formed in a same layer of an electronic device or integrated circuit (IC) that includes the semiconductor device, with a lateral displacement, as the semiconductor device 200 shown in FIG. 2. FIGS. 3A-3U are schematic cross-sectional views of various portions of the semiconductor device 200 illustrated in FIG. 2, and correspond to various processing stages of forming nanostructure transistors of the semiconductor device 200.

The semiconductor device 200 includes a semiconductor substrate 202. The semiconductor substrate 202 includes a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, a silicon carbide (SiC) substrate, or another type of semiconductor substrate. The semiconductor substrate 202 may include various layers, including conductive or insulating layers formed on a semiconductor substrate. The semiconductor substrate 202 may include a compound semiconductor and/or an alloy semiconductor. The semiconductor substrate 202 may include various doping configurations to satisfy one or more design parameters. For example, different doping profiles (e.g., n-wells, p-wells) may be formed on the semiconductor substrate 202 in regions designed for different device types (e.g., p-type metal-oxide semiconductor (PMOS) nanostructure transistors, n-type metal-oxide semiconductor (NMOS) nanostructure transistors). The suitable doping may include ion implantation of dopants and/or diffusion processes. Further, the semiconductor substrate 202 may include an epitaxial layer (epi-layer), may be strained for performance enhancement, and/or may have other suitable enhancement features. The semiconductor substrate 202 may include a portion of a semiconductor wafer on which other semiconductor devices are formed.

Fin structures 204 are included above (and/or extend above) the semiconductor substrate 202. A fin structure 204 provides a structure on which layers and/or other structures of the semiconductor device 200 are formed, such as epitaxial regions and/or gate structures, among other examples. In some implementations, the fin structures 204 include the same material as the semiconductor substrate 202 and are formed from the semiconductor substrate 202. In some implementations, the fin structures 204 include silicon (Si) materials or another elementary semiconductor material such as germanium (Ge). In some implementations, the fin structures 204 include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof.

The fin structures 204 are fabricated by suitable semiconductor process techniques, such as masking, photolithography, and/or etch processes, among other examples. As an example, the fin structures 204 may be formed by etching a portion of the semiconductor substrate 202 away to form recesses in the semiconductor substrate 202. The recesses may then be filled with isolating material that is recessed or etched back to form shallow trench isolation (STI) regions 206 above the semiconductor substrate 202 and between the fin structures 204. Other fabrication techniques for the STI regions 206 and/or for the fin structures 204 may be used. The STI regions 206 may electrically isolate adjacent fin structures 204 and may provide a layer on which other layers and/or structures of the semiconductor device 200 are formed. The STI regions 206 may include a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. The STI regions 206 may include a multi-layer structure, for example, having one or more liner layers.

The semiconductor device 200 includes a plurality of channels 208 that extend between, and are electrically coupled with, source/drain regions 210. The channels 208 include silicon-based nanostructures (e.g., nanosheets or nanowires, among other examples) that function as the semiconductive channels of the nanostructure transistor(s) of the semiconductor device 200. The channels 208 may include silicon germanium (SiGe) or another silicon-based material. The source/drain regions 210 include silicon (Si) with one or more dopants, such as a p-type material (e.g., boron (B) or germanium (Ge), among other examples), an n-type material (e.g., phosphorous (P) or arsenic (As), among other examples), and/or another type of dopant. Accordingly, the semiconductor device 200 may include p-type metal-oxide semiconductor (PMOS) nanostructure transistors that include p-type source/drain regions 210, n-type metal-oxide semiconductor (NMOS) nanostructure transistors that include n-type source/drain regions 210, and/or other types of nanostructure transistors.

In some implementations, the semiconductor device 200 includes a plurality of types of fin structures. For example, the fin structures 204 may be referred to as active fins in that the channels 208 and source/drain regions 210 are formed and included over the fin structures 204. Another type of fin structure includes hybrid fin structures. The hybrid fin structures may also be referred to as dummy fins, H-fins, or non-active fins, among other examples. Hybrid fin structures may be included between adjacent fin structures 204 (e.g., between adjacent active fin structures). The hybrid fins extend in a direction that is approximately parallel to the fin structures 204.

Hybrid fin structures are configured to provide electrical isolation between two or more structures and/or components included in the semiconductor device 200. In some implementations, a hybrid fin structure is configured to provide electrical isolation between two or more fin structures 204 (e.g., two or more active fin structures). In some implementations, a hybrid fin structure is configured to provide electrical isolation between two or more source/drain regions 210. In some implementations, a hybrid fin structure is configured to provide electrical isolation between two or more gates structures or two or more portions of a gate structure. In some implementations, a hybrid fin structure is configured to provide electrical isolation between a source/drain region 210 and a gate structure.

A hybrid fin structure may include a plurality of types of dielectric materials. A hybrid fin structure may include a combination of one or more low dielectric constant (low-k) dielectric materials (e.g., a silicon oxide ($SiO_x$) and/or a silicon nitride ($Si_xN_y$), among other examples) and one or more high dielectric constant (high-k) dielectric materials (e.g., a hafnium oxide ($HfO_x$) and/or other high-k dielectric material).

At least a subset of the channels 208 extend through one or more gate structures 212. The gate structures 212 may be formed of one or more metal materials, one or more high dielectric constant (high-k) materials, and/or one or more other types of materials. In some implementations, dummy gate structures (e.g., polysilicon (PO) gate structures or another type of gate structures) are formed in the place of (e.g., prior to formation of) the gate structures 212 so that one or more other layers and/or structures of the semiconductor device 200 may be formed prior to formation of the gate structures 212. This reduces and/or prevents damage to the gate structures 212 that would otherwise be caused by the formation of the one or more layers and/or structures. A replacement gate process (RGP) is then performed to remove the dummy gate structures and replace the dummy gate structures with the gate structures 212 (e.g., replacement gate structures).

As further shown in FIG. 2, portions of a gate structure 212 are formed in between pairs of channels 208 in an alternating vertical arrangement. In other words, the semiconductor device 200 includes one or more vertical stacks of alternating channels 208 and portions of a gate structure 212, as shown in FIG. 2. In this way, a gate structure 212 wraps around an associated channel 208 on all sides of the channel 208 which increases control of the channel 208, increases drive current for the nanostructure transistor(s) of the semiconductor device 200, and reduces short channel effects (SCEs) for the nanostructure transistor(s) of the semiconductor device 200.

Some source/drain regions 210 and gate structures 212 may be shared between two or more nanoscale transistors of the semiconductor device 200. In these implementations, one or more source/drain regions 210 and a gate structure 212 may be connected or coupled to a plurality of channels 208, as shown in the example in FIG. 2. This enables the plurality of channels 208 to be controlled by a single gate structure 212 and a pair of source/drain regions 210.

The semiconductor device 200 may also include an interlayer dielectric (ILD) layer 214 above the STI regions 206. The ILD layer 214 may be referred to as an ILD0 layer. The ILD layer 214 surrounds the gate structures 212 to provide electrical isolation and/or insulation between the gate structures 212 and/or the source/drain regions 210, among other examples. Conductive structures such as contacts and/or interconnects may be formed through the ILD layer 214 to the source/drain regions 210 and the gate structures 212 to provide control of the source/drain regions 210 and the gate structures 212.

As indicated above, FIG. 2 is provided as an example. Other examples may differ from what is described with regard to FIG. 2.

FIGS. 3A-3U are diagrams of an example implementation 300 described herein. Operations shown in the example implementation 300 may be performed in a different order than shown in FIGS. 3A-3U. The example implementation 300 includes an example of forming the semiconductor device 200 or a portion thereof (e.g., an example of forming nanostructure transistor(s) of the semiconductor device 200). The semiconductor device 200 may include one or more additional devices, structures, and/or layers not shown in FIGS. 3A-3U. The semiconductor device 200 may include additional layers and/or dies formed on layers above and/or below the portion of the semiconductor device 200 shown in FIGS. 3A-3U. Additionally, or alternatively, one or more additional semiconductor structures and/or semiconductor devices may be formed in a same layer of an electronic device that includes the semiconductor device 200.

Furthermore, the operations may encompass parameters described in connection with FIGS. 6, 7A, 7B, and 8, and elsewhere herein. In some implementations, the operations include forming a dielectric layer between a first fin structure (e.g., a first fin structure 204) that is above the semiconductor substrate 202 and a second fin structure (e.g., a second fin structure 204) that is above the semiconductor substrate 202 and is adjacent to the first fin structure. The operations may include removing portions of the dielectric layer to form the STI region 206 between the first fin structure and the second fin structure and to form a recess above the STI region 206. The operations may include forming, in the recess, a cladding layer over a first sidewall of the first fin structure, over a second sidewall of the second fin structure, and over a top surface of the STI region 206. The operations may include removing the cladding layer from the top surface of the STI region 206 to leave a first cladding sidewall layer along the first sidewall and a second cladding sidewall layer along the second sidewall. In some implementations, the first cladding sidewall layer and the second cladding sidewall layer include respective lengths that are asymmetric. The asymmetric lengths may provide sufficient electrical isolation for different types of fin structures (e.g., fin structures for p-type nanostructure transistors and fin structures for n-type nanostructure transistors) while reducing and/or minimizing footing of the first and second cladding sidewall layers on the STI region 206. The reduced and/or minimized footing may reduce the likelihood of electrical shorting in the semiconductor device 200.

FIGS. 3A and 3B respectively illustrate a perspective view of the semiconductor device 200 and a cross-sectional view along the line A-A in FIG. 3A. As shown in FIGS. 3A and 3B, processing of the semiconductor device 200 is performed in connection with the semiconductor substrate 202. A layer stack 302 is formed on the semiconductor substrate 202. The layer stack 302 may be referred to as a superlattice. In some implementations, one or more operations are performed in connection with the semiconductor substrate 202 prior to formation of the layer stack 302. For example, an anti-punch through (APT) implant operation may be performed. The APT implant operation may be performed in one or more regions of the semiconductor substrate 202 above which channels 208 are to be formed. The APT implant operation is performed, for example, to reduce and/or prevent punch-through or unwanted diffusion into the semiconductor substrate 202.

The layer stack 302 includes a plurality of alternating layers. The alternating layers include a plurality of first layers 304 and a plurality of second layers 306. The quantity of the first layers 304 and the quantity of the second layers 306 illustrated in FIGS. 3A and 3B are examples, and other quantities of the first layers 304 and the second layers 306 are within the scope of the present disclosure. In some implementations, the first layers 304 and the second layers 306 are formed to different thicknesses. For example, the second layers 306 may be formed to a thickness that is greater relative to a thickness of the first layers 304. In some implementations, the first layers 304 (or a subset thereof) are formed to a thickness in a range of approximately 4 nanometers to approximately 7 nanometers. In some implementations, the second layers 306 (or a subset thereof) are formed to a thickness in a range of approximately 8 nanometers to approximately 12 nanometers. However, other values for the thickness of the first layers 304 and for the thickness of the second layers 306 are within the scope of the present disclosure.

The first layers 304 include a first material composition, and the second layers 306 include a second material composition. In some implementations, the first material composition and the second material composition are the same material composition. In some implementations, the first material composition and the second material composition are different material compositions. As an example, the first layers 304 may include silicon germanium (SiGe) and the second layers 306 may include silicon (Si). In some implementations, the first material composition and the second material composition have different oxidation rates and/or etch selectivity.

As described herein, the second layers 306 may be processed to form the channel 208 for subsequently-formed nanostructure transistors of the semiconductor device 200. The first layers 304 are eventually removed and serve to define a vertical distance between an adjacent channel 208 for subsequently-formed nanostructure transistors of the semiconductor device 200. Accordingly, the first layers 304 may also be referred to as sacrificial layers, and the second layers 306 may be referred to as channel layers.

The deposition tool 102 deposits and/or grows the alternating layers to include nanostructures (e.g., nanosheets) on the semiconductor substrate 202. For example, the deposition tool 102 grows the alternating layers by epitaxial growth. However, other processes may be used to form the alternating layers of the layer stack 302. Epitaxial growth of the alternating layers of the layer stack 302 may be performed by a molecular beam epitaxy (MBE) process, a metalorganic chemical vapor deposition (MOCVD) process, and/or another suitable epitaxial growth process. In some implementations, the epitaxially grown layers such as the second layers 306 include the same material as the material of the semiconductor substrate 202. In some implementations, the first layers 304 and/or the second layers 306 include a material that is different from the material of the semiconductor substrate 202. As described above, in some implementations, the first layers 304 include epitaxially grown silicon germanium (SiGe) layers and the second layers 306 include epitaxially grown silicon (Si) layers. Alternatively, the first layers 304 and/or the second layers 306 may include other materials such as germanium (Ge), a compound semiconductor material such as silicon carbide (SiC), gallium arsenide (GaAs), gallium phosphide (GaP), indium phosphide (InP), indium arsenide (InAs), indium antimonide (InSb), an alloy semiconductor such as silicon germanium (SiGe), gallium arsenide phosphide (GaAsP), aluminum indium arsenide (AlInAs), aluminum gallium arsenide (AlGaAs), indium gallium arsenide (InGaAs), gallium indium phosphide (GaInP), gallium indium arsenide phosphide (GaInAsP), and/or a combination thereof. The material(s) of the first layers 304 and/or the material(s) of the second layers 306 may be chosen based on providing different oxidation properties, different etching selectivity properties, and/or other different properties.

As further shown in FIGS. 3A and 3B, the deposition tool 102 may form one or more additional layers over and/or on the layer stack 302. For example, a hard mask (HM) layer 308 may be formed over and/or on the layer stack 302 (e.g., on the top-most second layer 306 of the layer stack 302). As another example, a capping layer 310 may be formed over and/or on the hard mask layer 308. As another example, another hard mask layer including an oxide layer 312 and a nitride layer 314 may be formed over and/or on the capping layer 310. The one or more hard mask (HM) layers 308, 312, and 314 may be used to form one or more structures of the semiconductor device 200. The oxide layer 312 may function as an adhesion layer between the layer stack 302 and the nitride layer 314, and may act as an etch stop layer for etching the nitride layer 314. The one or more hard mask layers 308, 312, and 314 may include silicon germanium (SiGe), a silicon nitride ($Si_xN_y$), a silicon oxide ($SiO_x$), and/or another material. The capping layer 310 may include silicon (Si) and/or another material. In some implementations, the capping layer 310 is formed of the same material as the semiconductor substrate 202. In some implementations, the one or more additional layers are thermally grown, deposited by CVD, PVD, ALD, and/or are formed using another deposition technique.

Figures 3C, 3D:
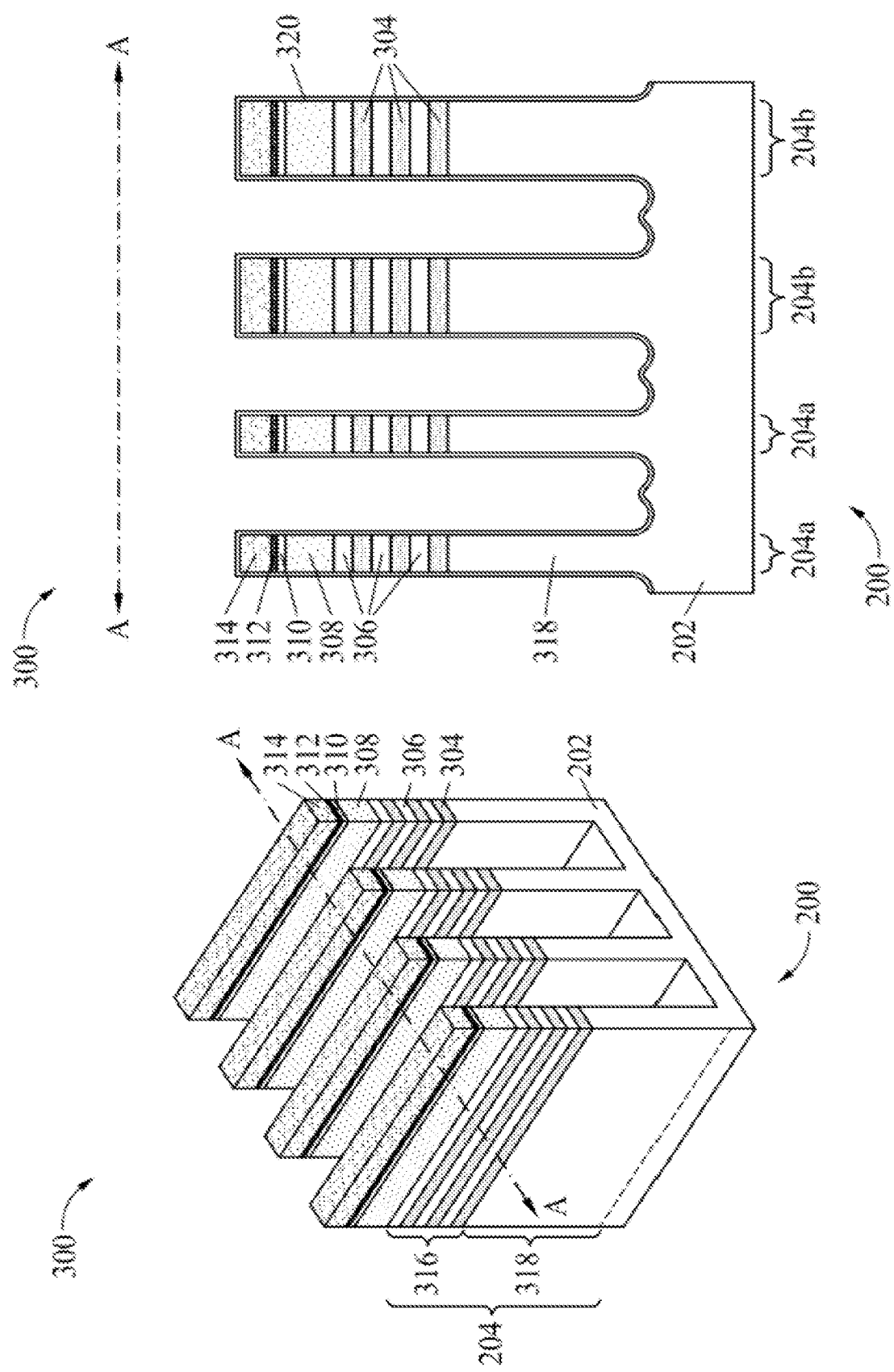

FIGS. 3C and 3D respectively illustrate a perspective view of the semiconductor device 200 and a cross-sectional view along the line A-A in FIG. 3C. As shown in FIGS. 3C and 3D, fin structures 204 are formed above the semiconductor substrate 202 of the semiconductor device 200. A fin structure 204 includes a portion 316 of the layer stack 302 over and/or on a portion 318 formed in and/or above the semiconductor substrate 202. The portion 318 of the fin structure 204 may be referred to as a mesa region (e.g., a silicon mesa) of the fin structure 204 on which the portion 316 of the layer stack 302 is included. The fin structures 204 may be formed by any suitable semiconductor processing technique. For example, the fin structures 204 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fin structures.

The fin structures 204 may subsequently be fabricated using suitable processes including photolithography and etch processes. In some implementations, the deposition tool 102 forms a photoresist layer over and/or on the hard mask layer including the oxide layer 312 and the nitride layer 314, the exposure tool 104 exposes the photoresist layer to radiation (e.g., deep ultraviolet (UV) radiation, extreme UV (EUV) radiation), a post-exposure bake process is performed (e.g., to remove residual solvents from the photoresist layer), and the developer tool 106 develops the photoresist layer to form a masking element (or pattern) in the photoresist layer. In some implementations, patterning the photoresist layer to form the masking element is performed using an electron beam (e-beam) lithography process. The masking element may then be used to protect portions of the semiconductor substrate 202 and portions the layer stack 302 in an etch operation such that the portions of the semiconductor substrate 202 and portions the layer stack 302 remain non-etched to form the fin structures 204. Unprotected portions of the substrate and unprotected portions of the layer stack 302 are etched (e.g., by the etch tool 108) to form trenches in the semiconductor substrate 202. The etch tool may etch the unprotected portions of the substrate and unprotected portions of the layer stack 302 using a dry etch technique (e.g., reactive ion etching), a wet etch technique, and/or a combination thereof.

In some implementations, another fin formation technique is used to form the fin structures 204. For example, a fin region may be defined (e.g., by mask or isolation regions), and the portions 316 may be epitaxially grown in the form of the fin structure 204. In some implementations, forming the fin structures 204 includes a trim process to decrease the width of the fin structures 204. The trim process may include wet and/or dry etching processes, among other examples.

As further shown in FIG. 3D, fin structures 204 may be formed for different types of nanostructure transistors for the semiconductor device 200. In particular, a first subset of fin structures 204a may be formed for p-type nanostructure transistors (e.g., p-type metal oxide semiconductor (PMOS) nanostructure transistors), and a second subset of fin structures 204b may be formed for n-type nanostructure transistors (e.g., n-type metal oxide semiconductor (NMOS) nanostructure transistors). The second subset of fin structures 204b may be doped with a p-type dopant (e.g., boron (B) and/or germanium (Ge), among other examples) and the first subset of fin structures 204a may be doped with an n-type dopant (e.g., phosphorous (P) and/or arsenic (As), among other examples). Additionally or alternatively, p-type source/drain regions 210 may be subsequently formed for the p-type nanostructure transistors that include the first subset of fin structures 204a, and n-type source/drain regions 210 may be subsequently formed for the n-type nanostructure transistors that include the second subset of fin structures 204b.

The first subset of fin structures 204a (e.g., PMOS fin structures) and the second subset of fin structures 204b (e.g., NMOS fin structures) may be formed to include similar properties and/or different properties. For example, the first subset of fin structures 204a may be formed to a first height and the second subset of fin structures 204b may be formed to a second height, where the first height and the second height are different heights. As another example, the first subset of fin structures 204a may be formed to a first width and the second subset of fin structures 204b may be formed to a second width, where the first width and the second width are different widths. In the example shown in FIG. 3D, the second width of the second subset of fin structures 204b (e.g., for the NMOS nanostructure transistors) is greater relative to the first width of the first subset of fin structures 204b (e.g., for the PMOS nanostructure transistors). However, other examples are within the scope of the present disclosure.

FIGS. 3E and 3F respectively illustrate a perspective view of the semiconductor device 200 and a cross-sectional view along the line A-A in FIG. 3E. As shown in FIGS. 3E and 3F, a liner 320 and a dielectric layer 322 are formed above the semiconductor substrate 202 and interposing (e.g., in between) the fin structures 204. The deposition tool 102 may deposit the liner 320 and the dielectric layer 322 over the semiconductor substrate 202 and in the trenches between the fin structures 204. The deposition tool 102 may form the dielectric layer 322 such that a height of a top surface of the dielectric layer 322 and a height of a top surface of the nitride layer 314 are approximately a same height.

Alternatively, the deposition tool 102 may form the dielectric layer 322 such that the height of the top surface of the dielectric layer 322 is greater relative to the height of the top surface of the nitride layer 314, as shown in FIGS. 3E and 3F. In this way, the trenches between the fin structures 204 are overfilled with the dielectric layer 322 to ensure the trenches are fully filled with the dielectric layer 322. Subsequently, the planarization tool 110 may perform a planarization or polishing operation (e.g., a CMP operation) to planarize the dielectric layer 322. The nitride layer 314 of the hard mask layer may function as a CMP stop layer in the operation. In other words, the planarization tool 110 planarizes the dielectric layer 322 until reaching the nitride layer 314 of the hard mask layer. Accordingly, a height of top surfaces of the dielectric layer 322 and a height of top surfaces of the nitride layer 314 are approximately equal after the operation.

The deposition tool 102 may deposit the liner 320 using a conformal deposition technique. The deposition tool 102 may deposit the dielectric layer using a CVD technique (e.g., a flowable CVD (FCVD) technique or another CVD technique), a PVD technique, an ALD technique, and/or another deposition technique. In some implementations, after deposition of the dielectric layer 322, the semiconductor device 200 is annealed, for example, to increase the quality of the dielectric layer 322.

The liner 320 and the dielectric layer 322 each includes a dielectric material such as a silicon oxide ($SiO_x$), a silicon nitride ($Si_xN_y$), a silicon oxynitride (SiON), fluoride-doped silicate glass (FSG), a low-k dielectric material, and/or another suitable insulating material. In some implementations, the dielectric layer 322 may include a multi-layer structure, for example, having one or more liner layers.

Figures 3G, 3H:
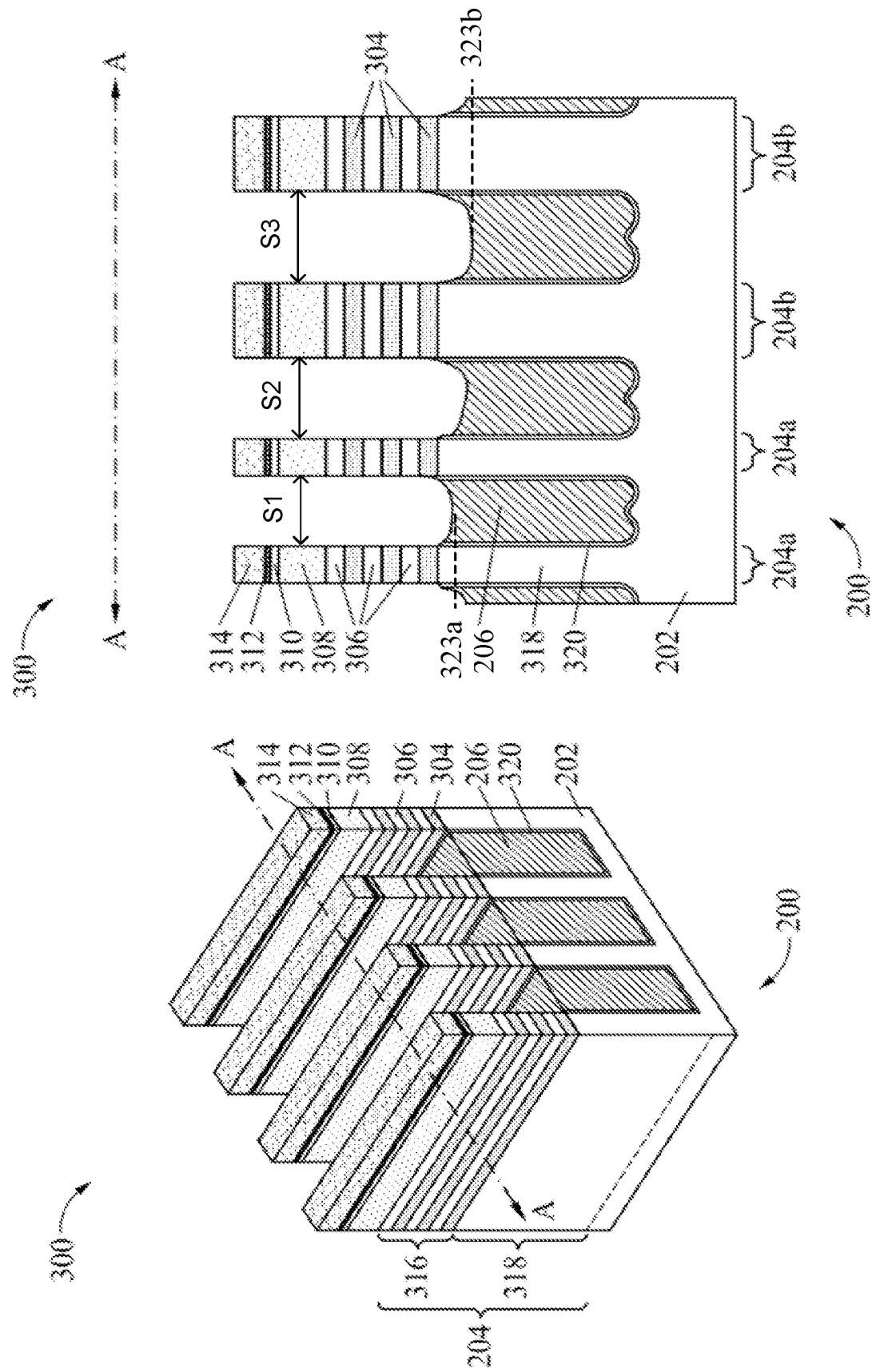

FIGS. 3G and 3H respectively illustrate a perspective view of the semiconductor device 200 and a cross-sectional view along the line A-A in FIG. 3G. As shown in FIGS. 3G and 3H, an etch back operation is performed to remove portions of the liner 320 and portions of the dielectric layer 322 to form the STI regions 206. The etch tool 108 may etch the liner 320 and the dielectric layer 322 in the etch back operation to form the STI regions 206. The etch tool 108 etches the liner 320 and the dielectric layer 322 based on the hard mask layer (e.g., the hard mask layer including the oxide layer 312 and the nitride layer 314). The etch tool 108 etches the liner 320 and the dielectric layer 322 such that the height of the STI regions 206 are less than or approximately a same height as the bottom of the portions 316 of the layer stack 302. Accordingly, the portions 316 of the layer stack 302 extend above the STI regions 206. In some implementations, the liner 320 and the dielectric layer 322 are etched such that the heights of the STI regions 206 are less than heights of top surfaces of the portions 318.

In some implementations, the etch tool 108 uses a plasma-based dry etch technique to etch the liner 320 and the dielectric layer 322. Ammonia ($NH_3$), hydrofluoric acid (HF), and/or another etchant may be used. The plasma-based dry etch technique may result in a reaction between the etchant(s) and the material of the liner 320 and the dielectric layer 322, including:

$$SiO_2 + 4HF \rightarrow SiF_4 + 2H_2O$$

where silicon dioxide ($SiO_2$) of the liner 320 and the dielectric layer 322 react with hydrofluoric acid to form byproducts including silicon tetrafluoride ($SiF_4$) and water ($H_2O$). The silicon tetrafluoride is further broken down by the hydrofluoric acid and ammonia to form an ammonium fluorosilicate (($NH_4)_2SiF_6$) byproduct:

$$SiF_4 + 2HF + 2NH_3 \rightarrow (NH_4)_2SiF_6$$

The ammonium fluorosilicate byproduct is removed from a processing chamber of the etch tool 108. After removal of the ammonium fluorosilicate, a post-process temperature in a range of approximately 200 degrees Celsius to approximately 250 degrees Celsius is used to sublimate the ammonium fluorosilicate into constituents of silicon tetrafluoride, ammonia, and hydrofluoric acid.

As further shown in FIG. 3H, the etch tool 108 may etch the liner 320 and the dielectric layer 322 such that a height 323a of the STI regions 206 between the first subset of fin structures 204a (e.g., for the PMOS nanostructure transistors) is greater relative to a height 323b of the STI regions 206 between the second subset of fin structures 204b (e.g., for the NMOS nanostructure transistors). This may occur due to the greater width the fin structures 204b relative to the width of the fin structures 204a, due to the different fin spacing between NMOS fin structures and PMOS fin structures, or a combination thereof. For example, the fin spacing (S1) between PMOS fin structures (P-P spacing) may be lesser relative to the fin spacing (S2) between a PMOS fin structure and an NMOS fin structure (P-N spacing or N-P spacing), and the fin spacing (S2) may be lesser relative to the fin spacing (S3) between NMOS fin structures (N-N spacing). In some implementations, the fin spacing (S1—P-P spacing) may be in a range of approximately 15 nanometers to approximately 20 nanometers, the fin spacing (S2—P-N spacing or N-P spacing) may be in a range of approximately 20 nanometers to approximately 25 nanometers, and the fin spacing (S3—N-N spacing) may be in a range of approximately 20 nanometers to approximately 30 nanometers. However, other values for these ranges are within the scope of the present disclosure.

Moreover, this results in a top surface of an STI region 206 between a fin structure 204a and a fin structure 204b being sloped or slanted (e.g., downward sloped from the fin structure 204a to the fin structure 204b, as shown in the example in FIG. 3H). The etchants used to etch the liner 320 and the dielectric layer 322 first experience physisorption (e.g., a physical bonding to the liner 320 and the dielectric layer 322) as a result of a Van der Waals force between the etchants and the surfaces of the liner 320 and the dielectric layer 322. The etchants become trapped by dipole movement force. The etchants then attach to dangling bonds of the liner 320 and the dielectric layer 322, and chemisorption begins. Here, the chemisorption of the etchant on the surface of the liner 320 and the dielectric layer 322 results in etching of the liner 320 and the dielectric layer 322. The greater width of the trenches between the second subset of fin structures 204b provides a greater surface area for chemisorption to occur, which results in a greater etch rate between the second subset of fin structures 204b. The greater etch rate results in the height of the STI regions 206 between the second subset of fin structures 204b being lesser relative to the height of the STI regions 206 between the first subset of fin structures 204a.

FIGS. 3I and 3J respectively illustrate a perspective view of the semiconductor device 200 and a cross-sectional view along the line A-A in FIG. 3I. As shown in FIGS. 3I and 3J, a cladding layer 324 is formed over the fin structures 204 (e.g., over the top surfaces and over the sidewalls of the fin structures 204) and over the STI regions 206 between the fin structures 204. The cladding layer 324 includes silicon germanium (SiGe) or another material. The cladding layer 324 may be formed of the same material as the first layers 304 to enable the cladding sidewall layers (that are to be formed from the cladding layer 324) and the first layers 304 to be removed in the same etch operation (a nanostructure release operation) so that a replacement gate (e.g., a gate structure 212) may be formed in the areas occupied by the cladding sidewall layers and the first layers 304. This enables the replacement gate to fully surround the nanostructure channels of the nanostructure transistors of the semiconductor device 200.

The deposition tool 102 may deposit the cladding layer 324. In some implementations, the deposition tool 102 deposits a seed layer (e.g., a silicon (Si) seed layer or another type of seed layer) over the fin structures 204 (e.g., over the top surfaces and over the sidewalls of the fin structures 204) and over the STI regions 206 between the fin structures 204. Then, the deposition tool 102 deposits silicon germanium on the seed layer to form the cladding layer 324. The seed layer promotes growth and adhesion of the cladding layer 324.

Deposition of the seed layer may include providing a silicon precursor to a processing chamber of the deposition tool 102 using a carrier gas such as nitrogen ($N_2$) or hydrogen ($H_2$), among other examples. In some implementations, a pre-clean operation is performed prior to deposition of the seed layer to reduce the formation of germanium oxide ($GeO_x$). The silicon precursor may include disilane ($Si_2H_6$) or another silicon precursor. The use of disilane may enable formation of a seed layer to a thickness that is in a range of approximately 0.5 nanometers to approximately 1.5 nanometers. If the thickness is less than this range, a rate of formation of the cladding layer 324 may be reduced, resulting in a thickness of cladding layer 324 that is insufficient. If the thickness is greater than this range, a rate of formation of the cladding layer 324 may be increased to an uncontrollable amount, which may result in a wide dispersion of the thickness of the cladding layer 324. However, other ranges and values for the thickness of the seed layer are within the scope of the present disclosure.

Deposition of the seed layer may be performed at a temperature in a range of approximately 450 degrees Celsius to approximately 500 degrees Celsius (or at a temperature in another range), at a pressure in a range of approximately 30 torr to approximately 100 torr (or at a pressure in another range), and/or for a time duration in a range of approximately 100 seconds to approximately 300 seconds (or for a time duration in another range), among other examples.

Deposition of the silicon germanium of the cladding layer 324 may include forming the cladding layer 324 to include an amorphous texture to promote conformal deposition of the cladding layer 324. The silicon germanium may include a germanium content in a range of approximately 15% germanium to approximately 25% germanium. However, other values for the germanium content are within the scope of the present disclosure. Deposition of the cladding layer 324 may include providing a silicon precursor (e.g., disilane ($Si_2H_6$) or silicon tetrahydride ($SiH_4$), among other examples) and a germanium precursor (e.g., germanium tetrahydride ($GeH_4$) or another germanium precursor) to a processing chamber of the deposition tool 102 using a carrier gas such as nitrogen ($N_2$) or hydrogen ($H_2$), among other examples. Deposition of the cladding layer 324 may be performed at a temperature in a range of approximately 500 degrees Celsius to approximately 550 degrees Celsius (or at a temperature in another range) and/or at a pressure in a range of approximately 5 torr to approximately 20 torr (or at a pressure in another range).

As described in greater detail in connection with FIG. 8 and elsewhere herein, parameters associated with deposition of the seed layer and the cladding layer 324 may reduce overhang and/or protrusions of the silicon germanium from the hard mask layer (e.g., the hard mask layer including the oxide layer 312 and the nitride layer 314). The parameters associated with the deposition of the seed layer and the cladding layer 324 may also enable selective etching of the cladding layer 324 to remove a footing formed near or above the STI region 206.

Figure 3L:
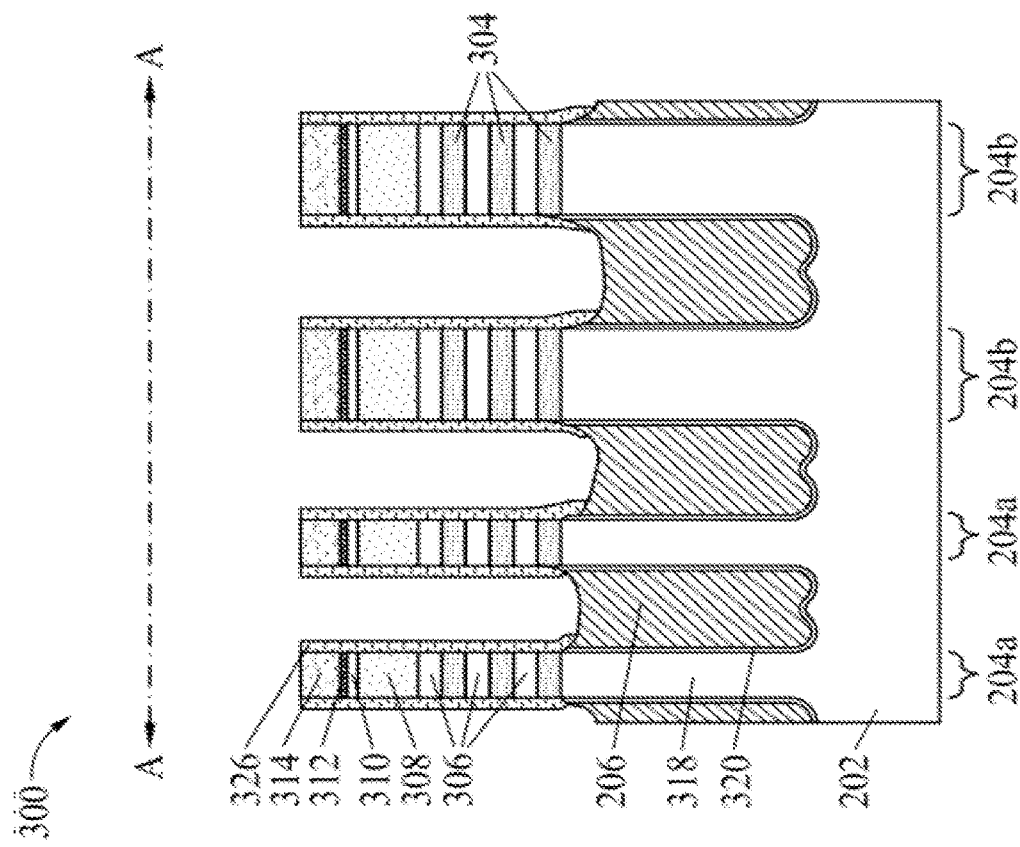
Figure 3K:
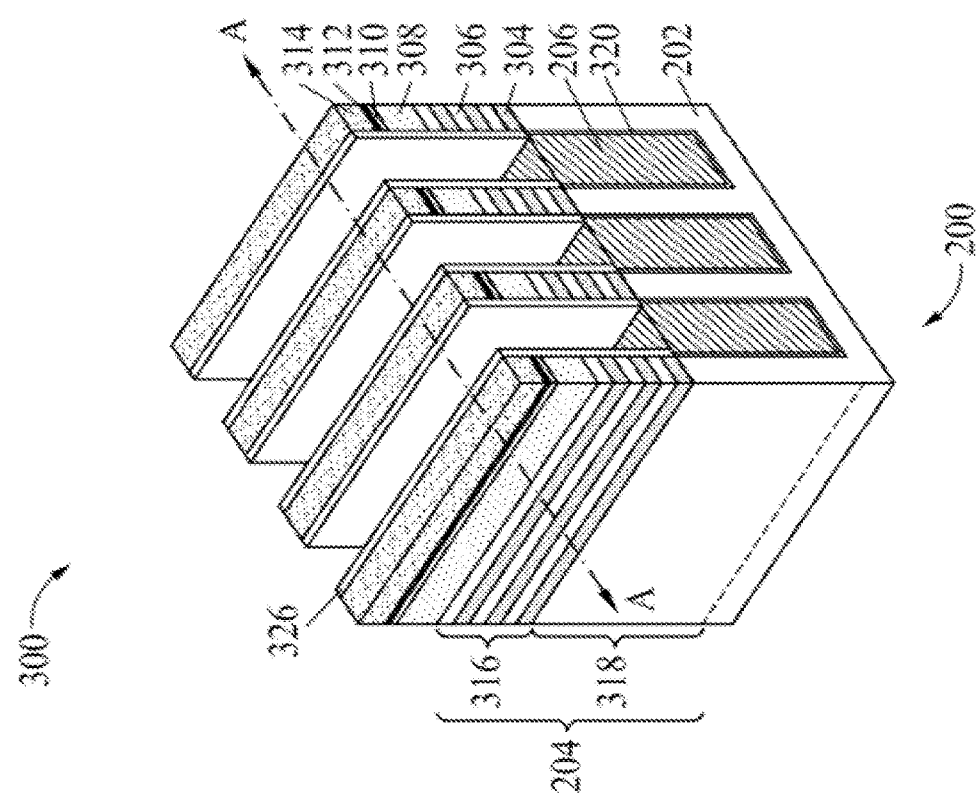

FIGS. 3K and 3L respectively illustrate a perspective view of the semiconductor device 200 and a cross-sectional view along the line A-A in FIG. 3K. As shown in FIGS. 3K and 3L, an etch back operation is performed to etch the cladding layer 324 to form cladding sidewall layers 326. The etch tool 108 may etch the cladding layer 324 using a plasma-based dry etch technique or another etch technique. The etch tool 108 may perform the etch back operation to remove portions of the cladding layer 324 from the tops of the fin structures 204 and from the tops of the STI regions 206. Removal of the cladding layer 324 from the tops of the STI regions 206 between the fin structures 204 ensures that the cladding sidewall layers 326 do not include a footing on the STI regions 206 between the fin structures 204. This ensures that the cladding sidewall layers 326 do not include a footing under the hybrid fin structures that are to be formed over the STI regions 206 between the fin structures 204.

In some implementations, the etch tool 108 uses a fluorine-based etchant to etch the cladding layer 324. The fluorine-based etchant may include sulfur hexafluoride ($SF_6$), fluoromethane ($CH_3F_3$), and/or another fluorine-based etchant. Other reactants and/or carriers such as methane ($CH_4$), hydrogen (H2), argon (Ar), and/or helium (He) may be used in the etch back operation. In some implementations, the etch back operation is performed using a plasma bias in a range of approximately 500 volts to approximately 2000 volts. However, other values for the plasma bias are within the scope of the present disclosure. In some implementations, removing portions of the cladding layer 324 from the tops of the STI regions 206 includes performing a highly direction (e.g., anisotropic) etch to selectively remove (e.g., selectively etch) the cladding layer 324 on the tops of the STI regions 206 between the fin structures 204, as described above.

Figure 6:
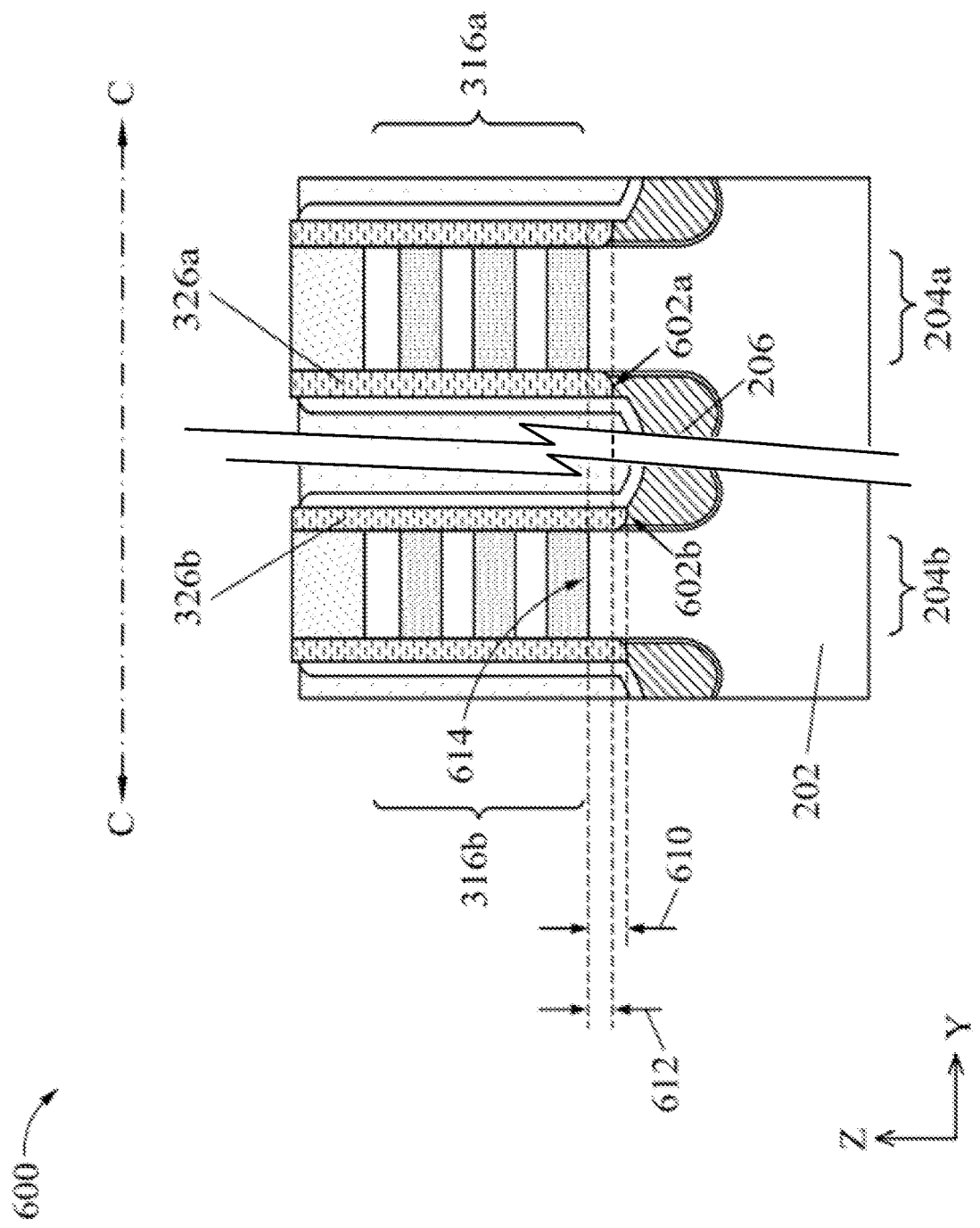
Figure 7A:
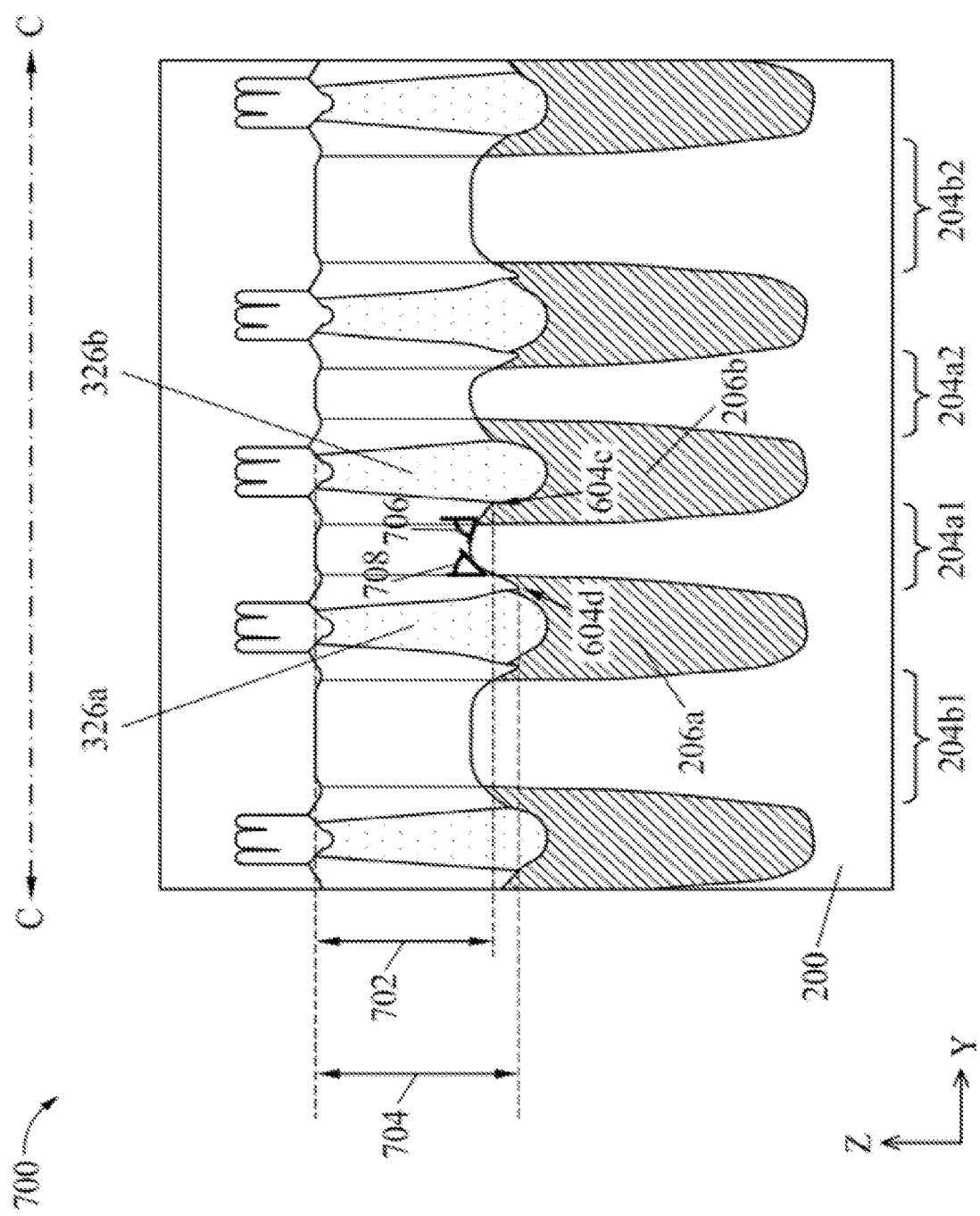
Figure 7B:
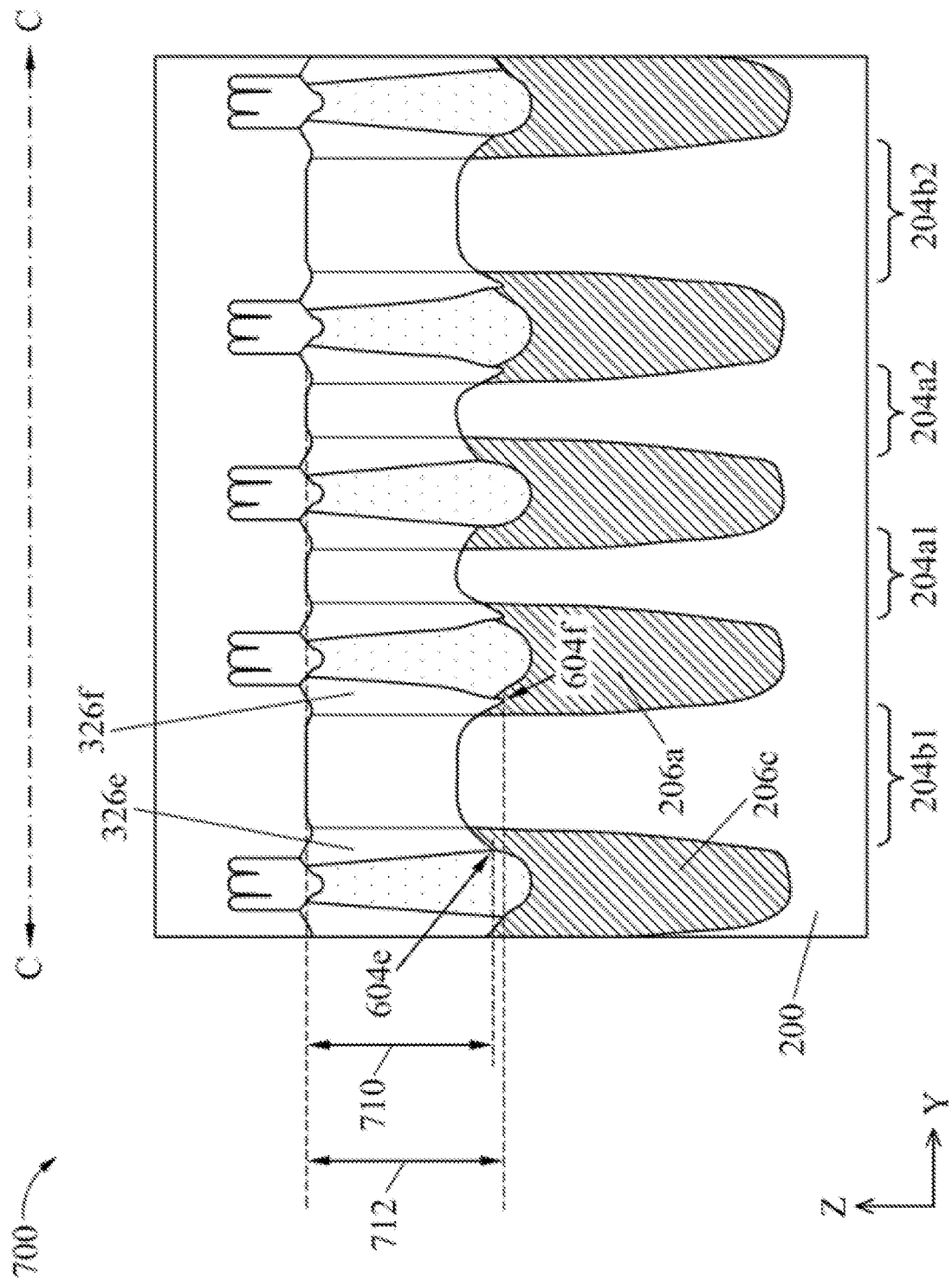

As described in greater detail and in connection with FIGS. 6, 7A, and 7B, and elsewhere herein, the cladding sidewall layers 326 may include asymmetric properties (e.g., different lengths, depths, and/or angles) relative to the STI region 206, the fin structures 204a, and/or the fin structures 204b. The asymmetric properties provide sufficient depth of the metal gates for different types of fin structures (e.g., fin structures for p-type nanostructure transistors and fin structures for n-type nanostructure transistors) while reducing and/or minimizing footing of the cladding sidewall layers 326 (and thus, reducing and/or minimizing footing of the gate structures 212 that are formed in the areas that are occupied by the cladding sidewall layers 326 after removal of the cladding sidewall layers 326) on the STI region 206 under hybrid fin structures of the nanostructure transistors of the semiconductor device 200. The reduced and/or minimized footing further reduces a likelihood of electrical shorting. The asymmetric properties may result from forming the STI regions 206 to different heights, may result from forming sloped or asymmetric STI regions 206, may result from forming the fin structures 204 to different widths for PMOS nanostructure transistors and NMOS nanostructures, and/or may result from forming the fin structures 204 to different fin spacings between the fin structures 204, as described above.

Figure 3N:
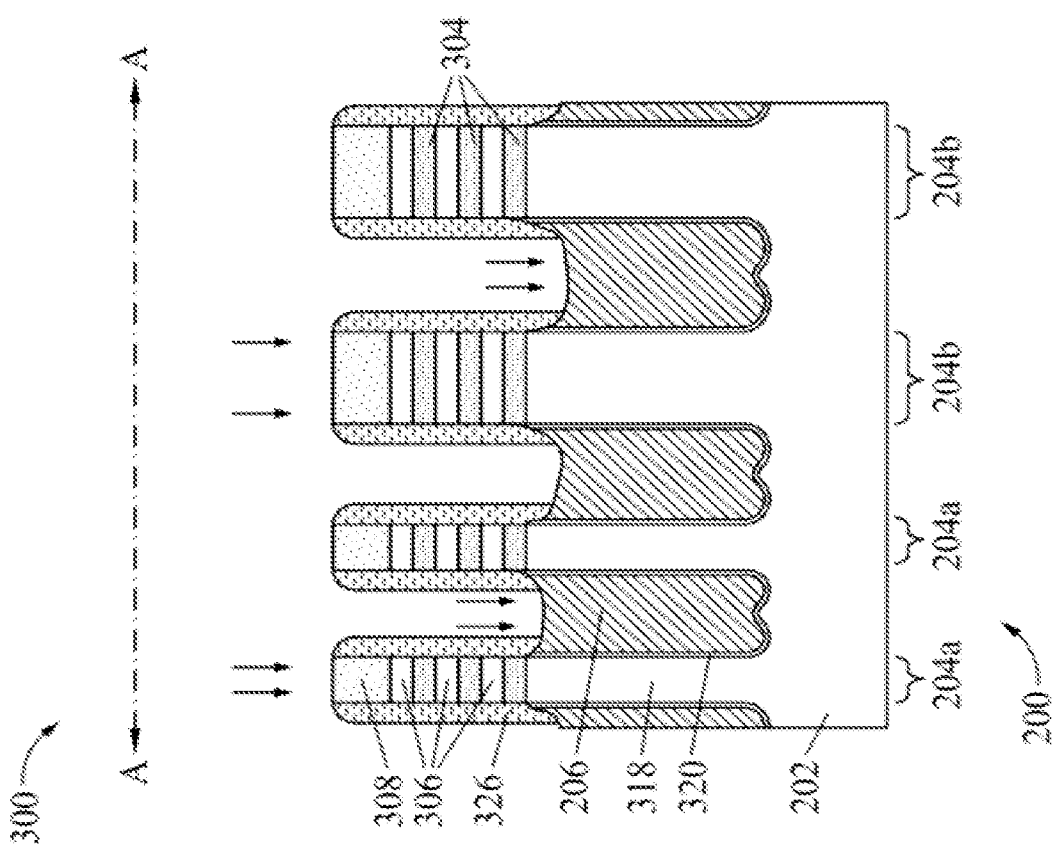
Figure 3M:
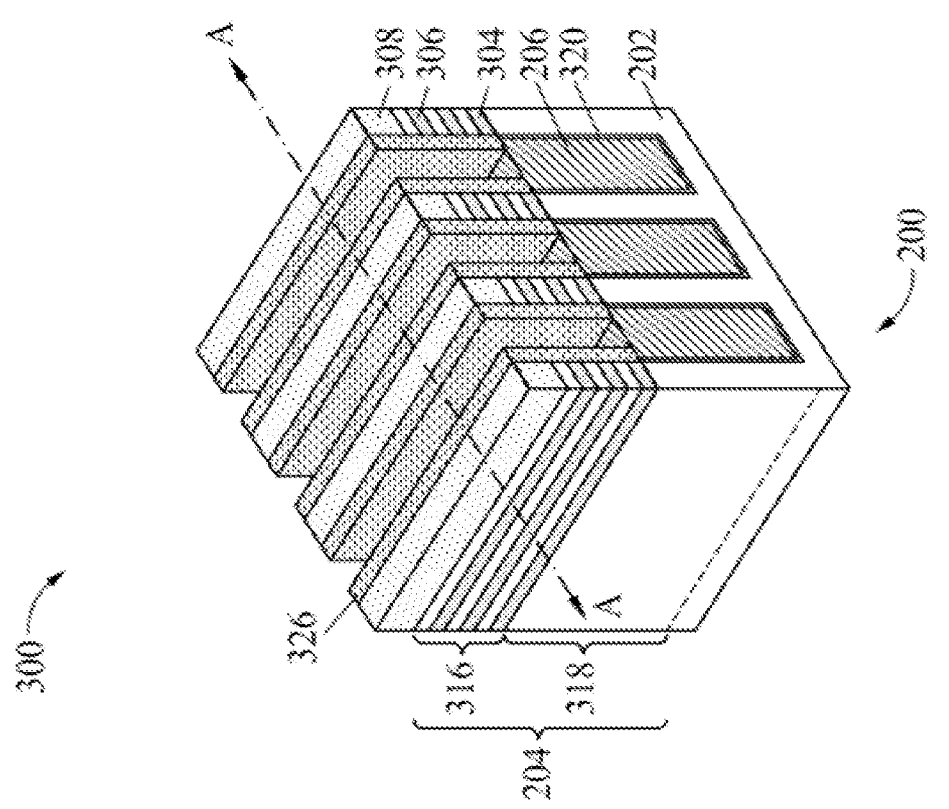

FIGS. 3M and 3N respectively illustrate a perspective view of the semiconductor device 200 and a cross-sectional view along the line A-A in FIG. 3M. As shown in FIGS. 3M and 3N, the hard mask layer (including the oxide layer 312 and the nitride layer 314) and the capping layer 310 are removed to expose the hard mask layer 308. In some implementations, the capping layer 310, the oxide layer 312, and the nitride layer 314 are removed using an etch operation (e.g., performed by the etch tool 108), a planarization technique (e.g., performed by the planarization tool 110), and/or another semiconductor processing technique.

Figures 3O, 3P:
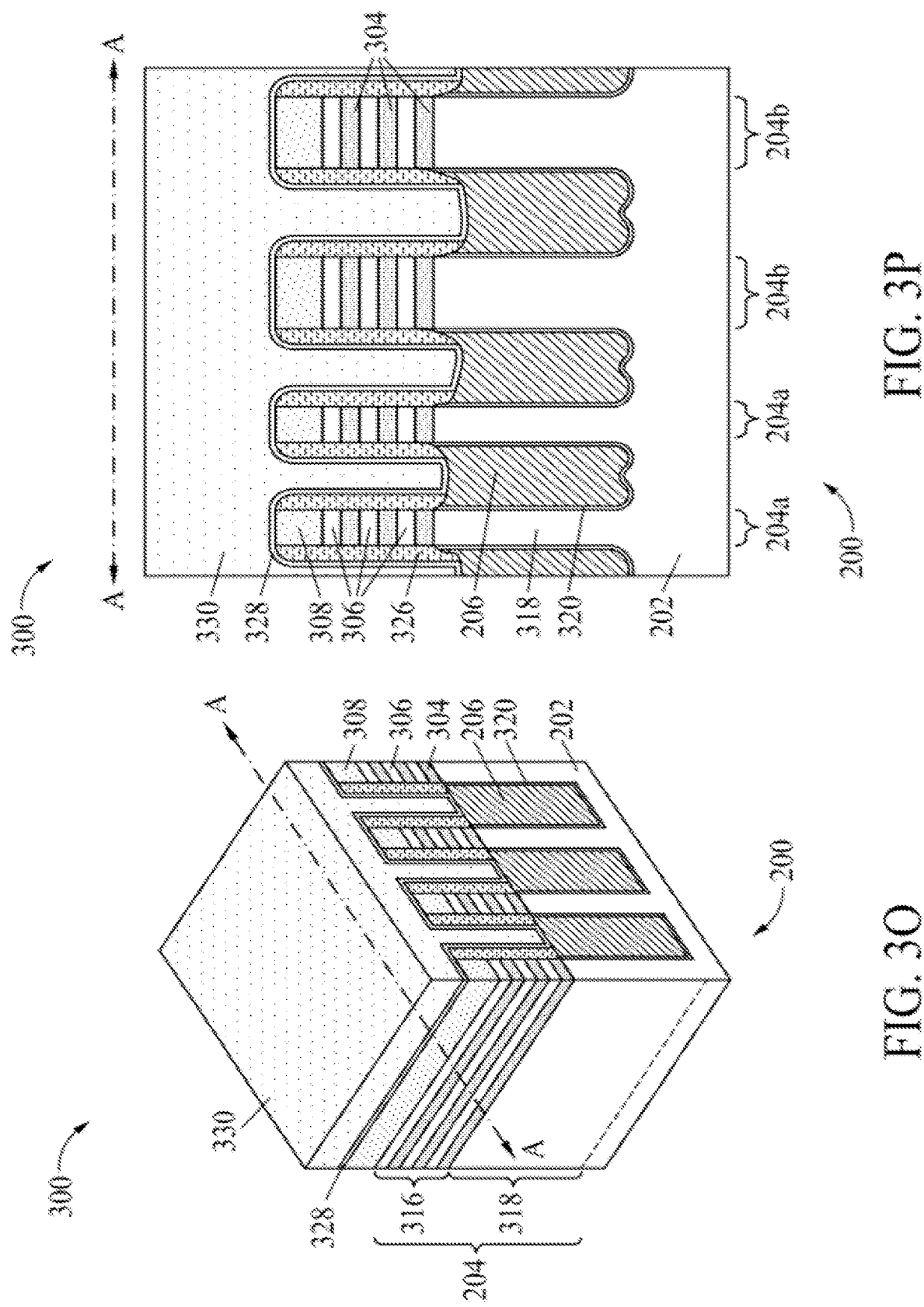

FIGS. 3O and 3P respectively illustrate a perspective view of the semiconductor device 200 and a cross-sectional view along the line A-A in FIG. 3O. As shown in FIGS. 3O and 3P, a liner 328 and a dielectric layer 330 are formed above the semiconductor substrate 202 and interposing (e.g., in between) the fin structures 204. The deposition tool 102 may deposit the liner 328 and the dielectric layer 330 over the semiconductor substrate 202 and between the cladding sidewall layers 326 in the trenches between the fin structures 204. The deposition tool 102 may form the dielectric layer 330 such that a height of a top surface of the dielectric layer 330 and a height of a top surface of the hard mask layer 308 are approximately a same height.

Alternatively, the deposition tool 102 may form the dielectric layer 330 such that the height of the top surface of the dielectric layer 330 is greater relative to the height of the top surface of the hard mask layer 308, as shown in FIGS. 3O and 3P. In this way, the trenches between the fin structures 204 are overfilled with the dielectric layer 330 to ensure the trenches are fully filled with the dielectric layer 330. Subsequently, the planarization tool 110 may perform a planarization or polishing operation (e.g., a CMP operation) to planarize the dielectric layer 330.

The deposition tool 102 may deposit the liner 328 using a conformal deposition technique. The deposition tool 102 may deposit the dielectric layer 330 using a CVD technique (e.g., a flowable CVD (FCVD) technique or another CVD technique), a PVD technique, an ALD technique, and/or another deposition technique. In some implementations, after deposition of the dielectric layer 330, the semiconductor device 200 is annealed, for example, to increase the quality of the dielectric layer 330.

The liner 328 and the dielectric layer 330 each includes a dielectric material such as a silicon oxide ($SiO_x$), a silicon nitride ($Si_xN_y$), a silicon oxynitride (SiON), a silicon carbon nitride (SiCN), fluoride-doped silicate glass (FSG), a low-k dielectric material, and/or another suitable insulating material. In some implementations, the dielectric layer 330 may include a multi-layer structure, for example, having one or more liner layers.

Figures 3Q, 3R:
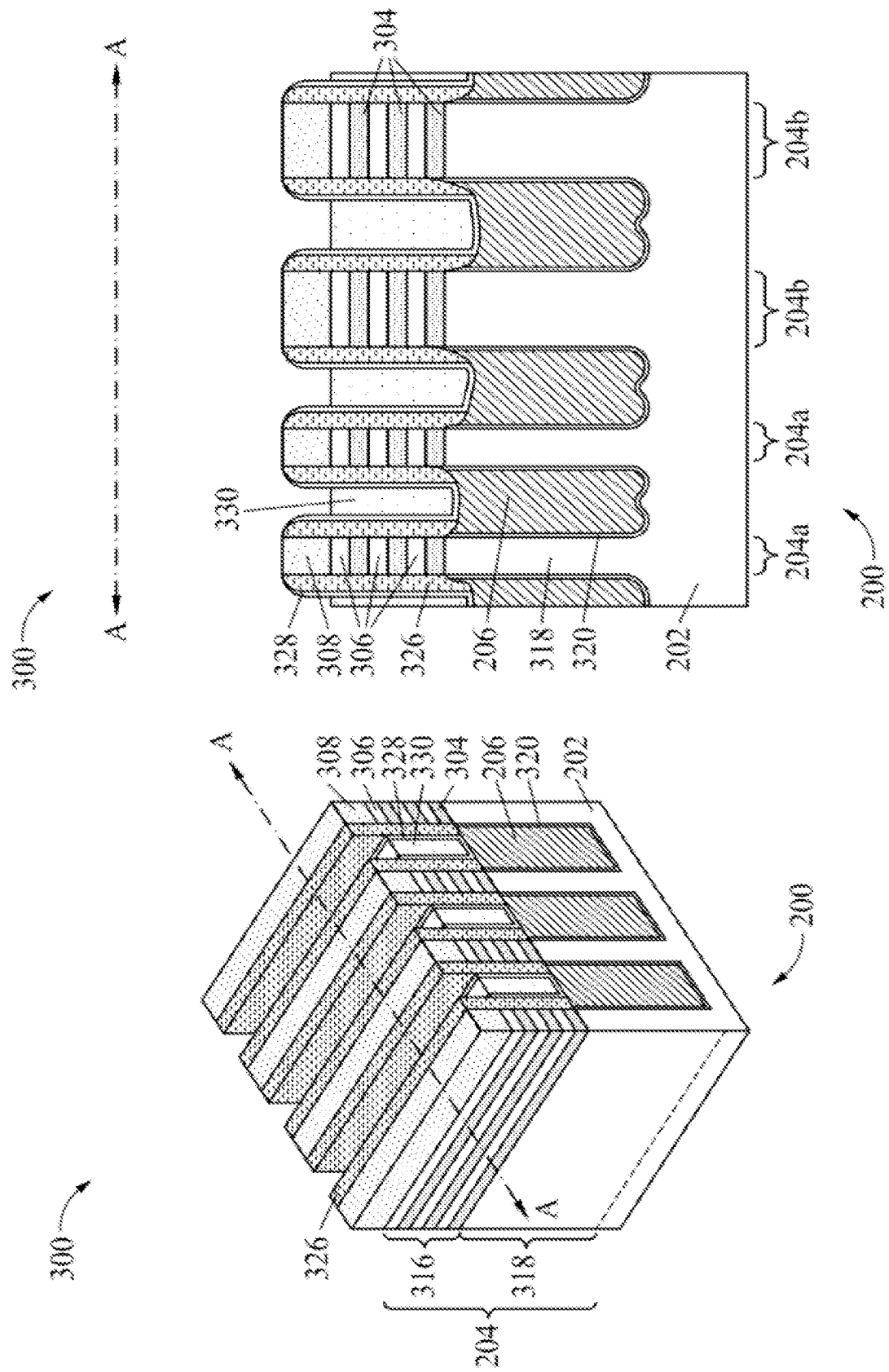

FIGS. 3Q and 3R respectively illustrate a perspective view of the semiconductor device 200 and a cross-sectional view along the line A-A in FIG. 3Q. As shown in FIGS. 3Q and 3R, an etch back operation is performed to remove portions of the dielectric layer 330. The etch tool 108 may etch the dielectric layer 330 in the etch back operation to reduce a height of a top surface of the dielectric layer 330. In particular, the etch tool 108 etches the dielectric layer 330 such that the height of portions of the dielectric layer 330 between the fin structures 204 is less than the height of the top surface of the hard mask layer 308. In some implementations, the etch tool 108 etches the dielectric layer 330 such that the height of portions of the dielectric layer 330 between the fin structures 204 is approximately equal to a height of top surfaces of the top-most of the second layers 306 of the portions 316.

Figures 3S, 3T:
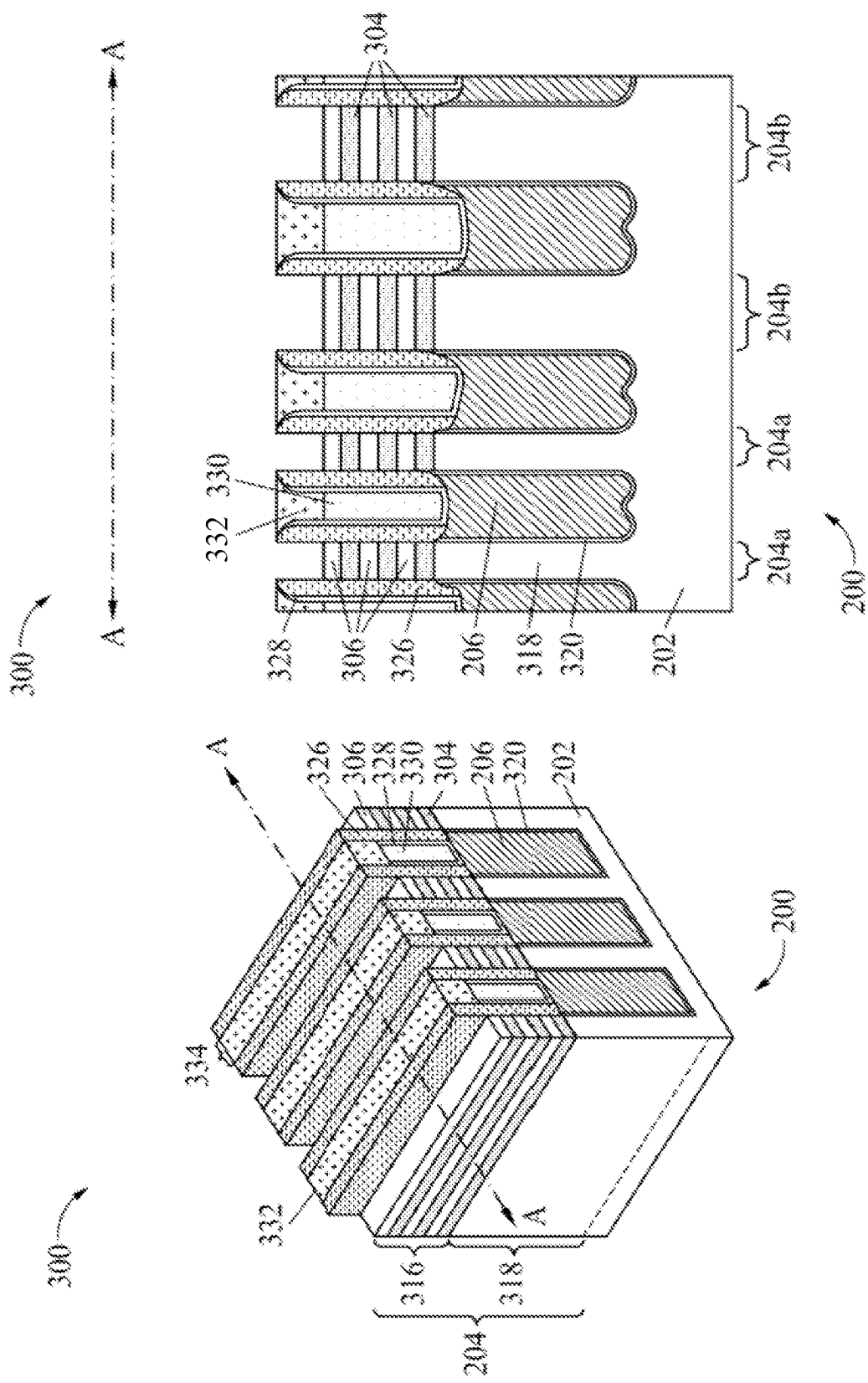
Figure 3U:
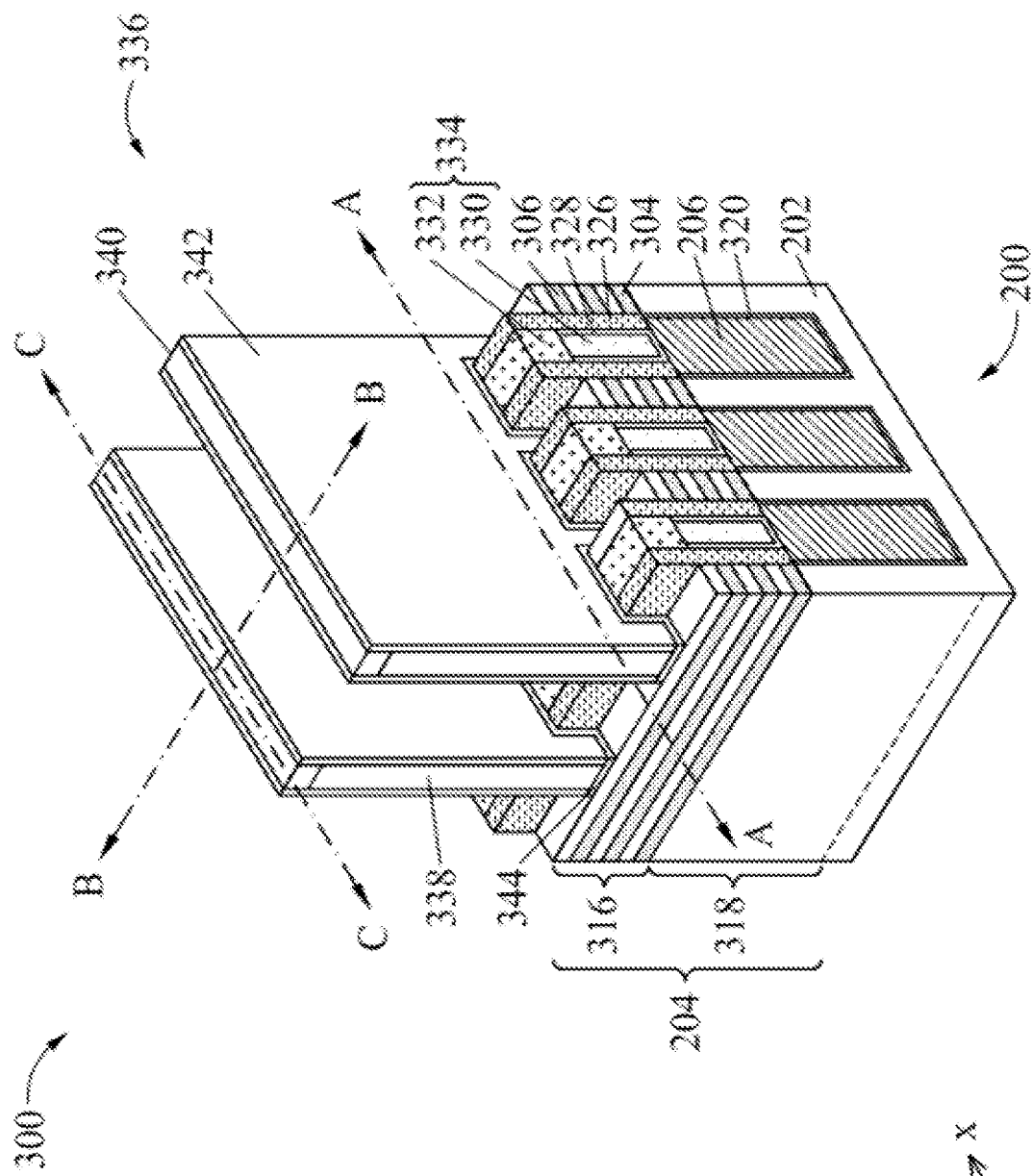

FIGS. 3S and 3T respectively illustrate a perspective view of the semiconductor device 200 and a cross-sectional view along the line A-A in FIG. 3S. As shown in FIGS. 3S and 3T, a high dielectric constant (high-k) layer 332 is deposited over the portions of the dielectric layer 330 between the fin structures 204. The deposition tool 102 may deposit a high-k material such as a hafnium oxide ($HfO_x$) and/or another high-k dielectric material to form the high-k layer 332 using a CVD technique, a PVD technique, an ALD technique, and/or another deposition technique. The combination of the portions of the dielectric layer 330 between the fin structures 204 and the high-k layer 332 between the fin structures 204 is referred to as a hybrid fin structure 334 (or dummy fin structure). The hybrid fin structure 334, which may be located between the second layers 306 (e.g., nanostructures) and the first layers 304 (e.g., sacrificial nanostructures) of the fin structures 204, may comprise the dielectric layer 330 and the high-k dielectric layer 332 over the dielectric layer 330. In some implementations, the planarization tool 110 may perform a planarization operation to planarize the high-k layer 332 such that a height of a top surface of the high-k layer 332 and the height of the hard mask layer 308 are approximately equal.

Subsequently, and as shown in FIGS. 3S and 3T, the hard mask layer 308 is removed. Removal of the hard mask layer 308 may include using an etch technique (e.g., a plasma etch technique, a wet chemical etch technique, and/or another type of etch technique) or another removal technique.

FIG. 3U illustrates a perspective view of the semiconductor device 200. As shown in FIG. 3U, dummy gate structures 336 (also referred to as dummy gate stacks) are formed over the fin structures 204 and over the hybrid fin structures 334. The dummy gate structures 336 are sacrificial structures that are to be replaced by replacement gate structures (or replacement gate stacks) at a subsequent processing stage for the semiconductor device 200. Portions of the fin structures 204 underlying the dummy gate structures 336 may be referred to as channel regions. The dummy gate structures 336 may also define source/drain (S/D) regions of the fin structures 204, such as the regions of the fin structures 204 adjacent and on opposing sides of the channel regions.

A dummy gate structure 336 may include a gate electrode layer 338, a hard mask layer 340 over and/or on the gate electrode layer 338, and spacer layers 342 on opposing sides of the gate electrode layer 338 and on opposing sides of the hard mask layer 340. The dummy gate structures 336 may be formed on a gate dielectric layer 344 between the fin structures 204 and the dummy gate structures 336, and between the hybrid fin structures 334 and the dummy gate structures 336. The gate electrode layer 338 includes polycrystalline silicon (polysilicon or PO) or another material. The hard mask layer 340 includes one or more layers such as an oxide layer (e.g., a pad oxide layer that may include silicon dioxide ($SiO_2$) or another material) and a nitride layer (e.g., a pad nitride layer that may include a silicon nitride such as $Si_3N_4$ or another material) formed over the oxide layer. The spacer layers 342 include a silicon oxycarbide (SiOC), a nitrogen free SiOC, or another suitable material. The gate dielectric layer 344 may include a silicon oxide (e.g., $SiO_x$ such as $SiO_2$), a silicon nitride (e.g., $Si_xN_y$ such as $Si_3N_4$), a high-K dielectric material and/or another suitable material.

The layers of the dummy gate structures 336 may be formed using various semiconductor processing techniques such as deposition (e.g., by the deposition tool 102), patterning (e.g., by the exposure tool 104 and the developer tool 106), and/or etching (e.g., by the etch tool 108), among other examples. Examples include CVD, PVD, ALD, thermal oxidation, e-beam evaporation, photolithography, e-beam lithography, photoresist coating (e.g., spin-on coating), soft baking, mask aligning, exposure, post-exposure baking, photoresist developing, rinsing, drying (e.g., spin-drying and/or hard baking), dry etching (e.g., reactive ion etching), and/or wet etching, among other examples.

In some implementations, the gate dielectric layer 344 is conformally deposited on the semiconductor device 200 and then selectively removed from portions of the semiconductor device 200 (e.g., the source/drain areas). The gate electrode layer 338 is then deposited onto the remaining portions of the gate dielectric layer 344. The hard mask layers 340 are then deposited onto the gate electrode layers 338. The spacer layers 342 may be conformally deposited in a similar manner as the gate dielectric layer 344. In some implementations, the spacer layers 342 include a plurality of types of spacer layers. For example, the spacer layers 342 may include a seal spacer layer that is formed on the sidewalls of the dummy gate structures 336 and a bulk spacer layer that is formed on the seal spacer layer. The seal spacer layer and the bulk spacer layer may be formed of similar materials or different materials. In some implementations, the bulk spacer layer is formed without plasma surface treatment that is used for the seal spacer layer. In some implementations, the bulk spacer layer is formed to a greater thickness relative to the thickness of the seal spacer layer.

FIG. 3U further illustrates reference cross-sections that are used in later figures, including FIGS. 4A-4D. Cross-section A-A is in an x-z plane (referred to as a y-cut) across the fin structures 204 and the hybrid fin structures 334 in source/drain areas of the semiconductor device 200. Cross-section B-B is in a y-z plane (referred to as an x-cut) perpendicular to the cross-section A-A, and is across the dummy gate structures 336 in the source/drain areas of the semiconductor device 200. Cross-section C-C is in the x-z plane parallel to the cross-section A-A and perpendicular to the cross-section B-B, and is along a dummy gate structures 336. Subsequent figures refer to these reference cross-sections for clarity. In some figures, some reference numbers of components or features illustrated therein may be omitted to avoid obscuring other components or features for ease of depicting the figures.

As indicated above, the number and arrangement of operations and devices shown in FIGS. 3A-3U are provided as one or more examples. In practice, there may be additional operations and devices, fewer operations and devices, different operations and devices, or differently arranged operations and devices than those shown in FIGS. 3A-3U.

FIGS. 4A-4D are diagrams of an example implementation 400 described herein. The example implementation 400 includes an example of forming source/drain regions in the source/drain areas of the semiconductor device 200. FIGS. 4A-4D are illustrated from a plurality of perspectives illustrated in FIG. 3U, including the perspective of the cross-sectional plane A-A in FIG. 3U, the perspective of the cross-sectional plane B-B in FIG. 3U, and the perspective of the cross-sectional plane C-C in FIG. 3U. In some implementations, the operations described in connection with the example implementation 400 are performed after the operations described in connection with FIGS. 3A-3U.

Figure 4A:
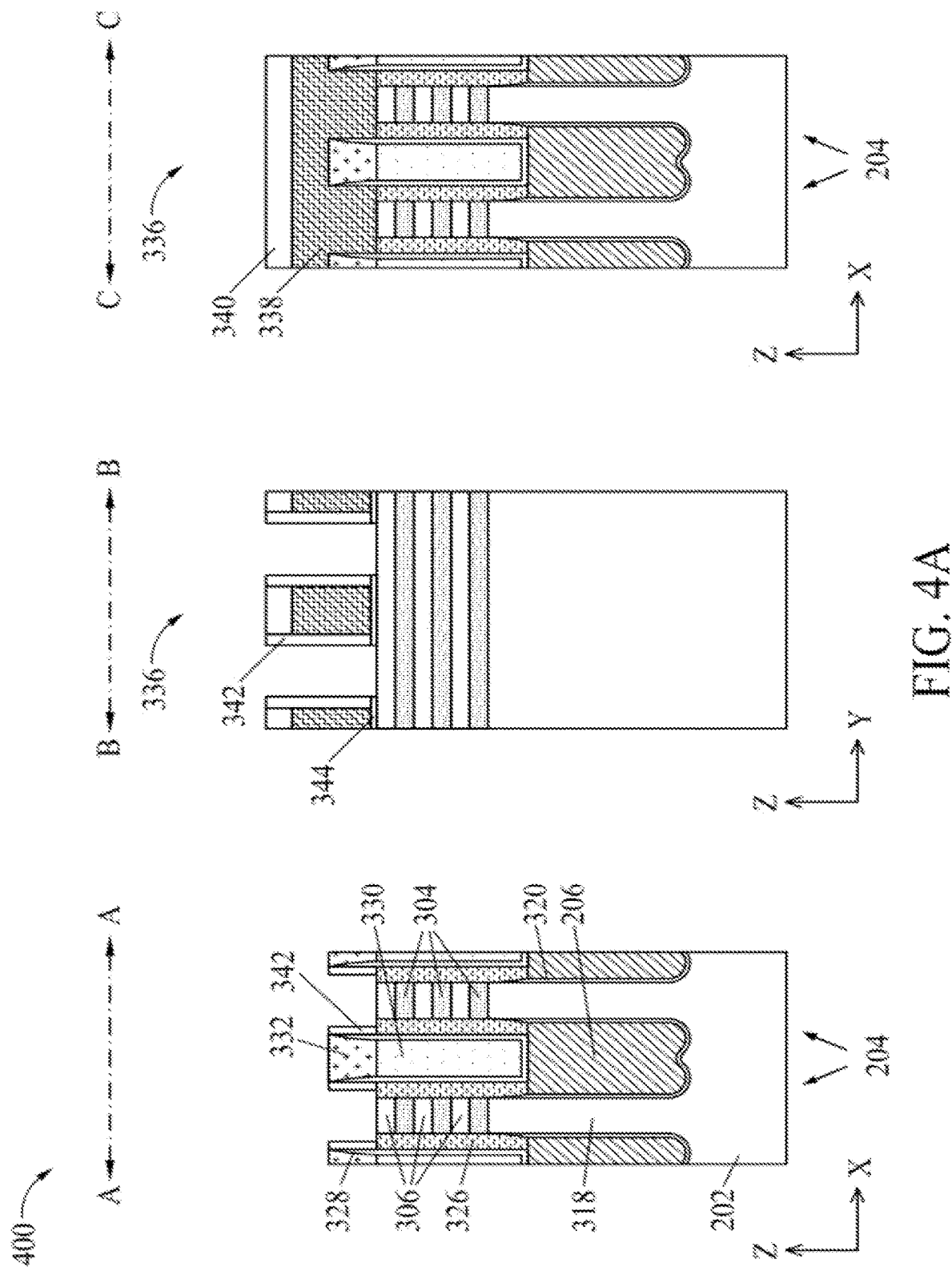

As shown in FIG. 4A, the dummy gate structures 336 are formed above the fin structures 204. As shown in the cross-sectional plane C-C in FIG. 4A, portions of the gate dielectric layer 344 and portions of the gate electrode layers 338 are formed in recesses above the fin structures 204 that are formed as a result of the removal of the hard mask layer 308. The formation of the dummy gate structures 336 is described in connection with FIG. 3U.

Figure 4B:
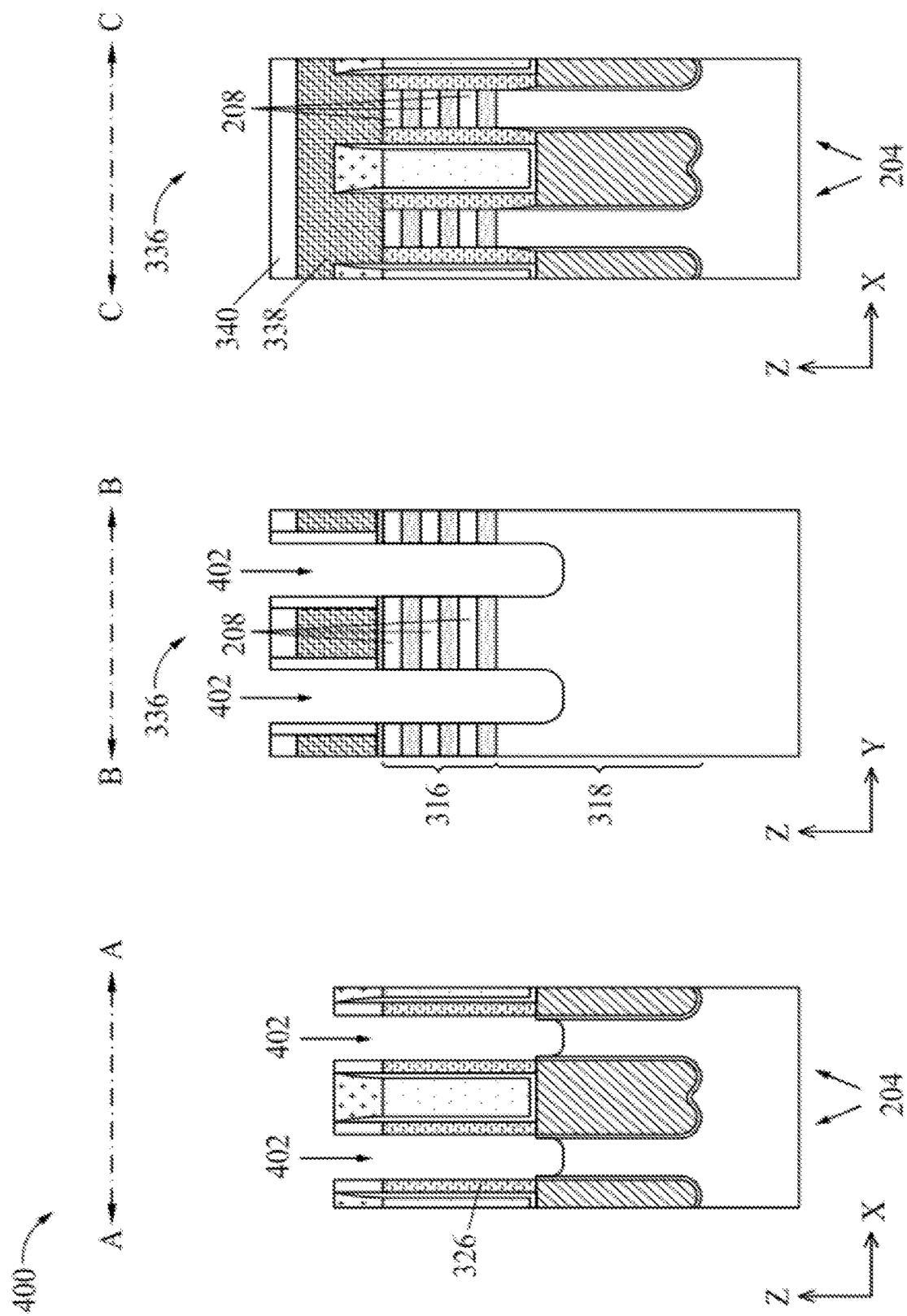

As shown in the cross-sectional plane A-A and cross-sectional plane B-B in FIG. 4B, source/drain recesses 402 are formed in the portions 316 of the fin structure 204 in an etch operation. The source/drain recesses 402 are formed to provide spaces in which source/drain regions 210 are to be formed on opposing sides of the dummy gate structures 336. The etch operation may be performed by the etch tool 108 and may be referred to a strained source/drain (SSD) etch operation. In some implementations, the etch operation includes a plasma etch technique, a wet chemical etch technique, and/or another type of etch technique.

As further shown in the cross-sectional plane A-A and cross-sectional plane B-B in FIG. 4B, the source/drain recesses 402 may further be formed into the portions 318 of the fin structure 204 (e.g., into the mesa region of the fin structures 204). In these implementations, the source/drain recesses 402 penetrate into a well portion (e.g., a p-well, an n-well) of the fin structure 204. In implementations in which the semiconductor substrate 202 includes a silicon (Si) material having a (100) orientation, (111) faces are formed at bottoms of the source/drain recesses 402, resulting in formation of a V-shape or a triangular shape cross section at the bottoms of the source/drain recesses 402. In some implementations, a wet etching using tetramethylammonium hydroxide (TMAH) and/or a chemical dry etching using hydrochloric acid (HCl) are employed to form the V-shape profile.

As shown in the cross-sectional plane B-B and the cross-sectional plane C-C in FIG. 4B, portions of the first layers 304 and portions of the second layers 306 of the layer stack 302 remain under the dummy gate structures 336 after the etch operation to form the source/drain recesses 402. The portions of the second layers 306 under the dummy gate structures 336 form the channels 208 of the nanostructure transistors of the semiconductor device 200.

Figure 4C:
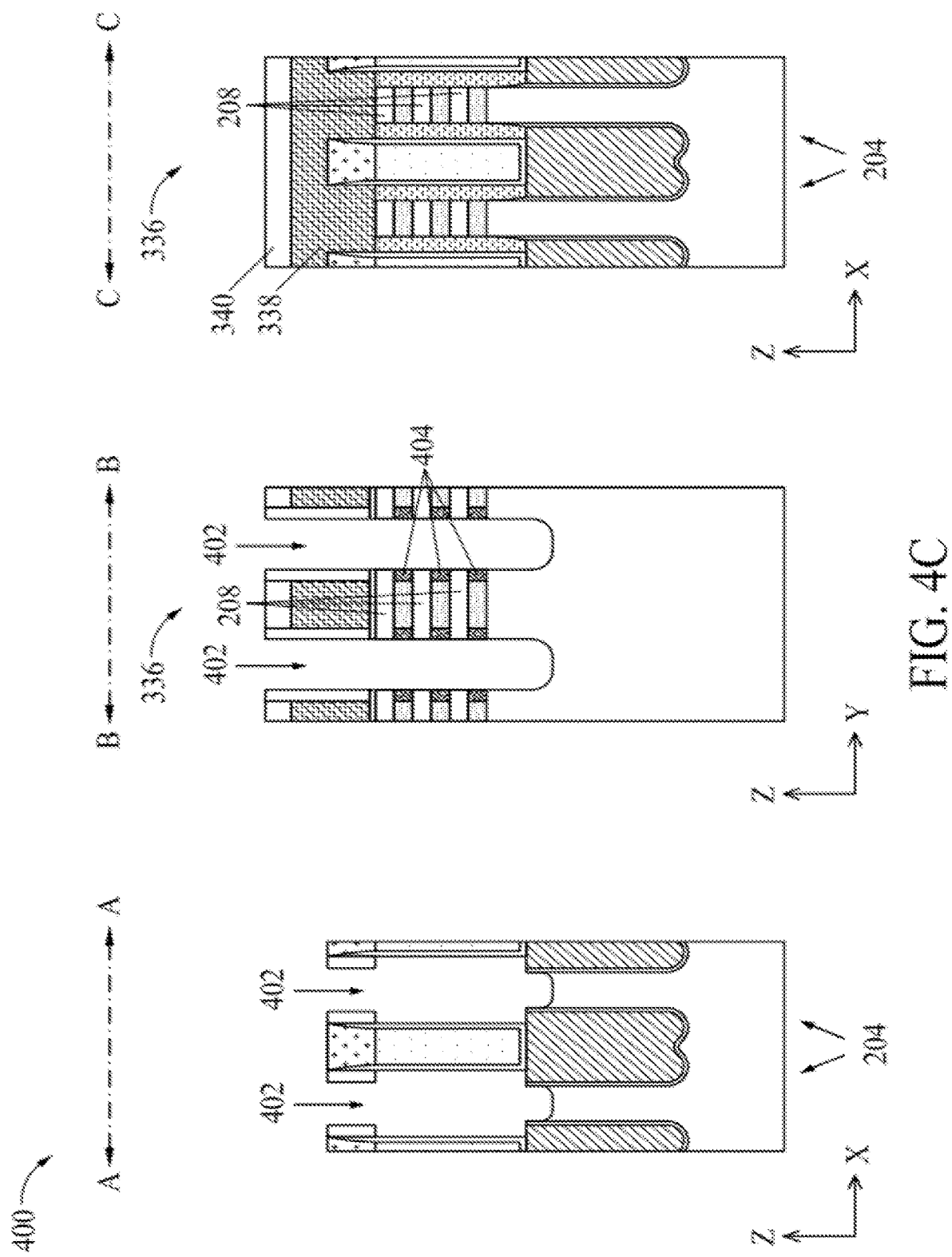

As further shown in the cross-sectional plane B-B in FIG. 4C, the deposition tool 102 forms inner spacer (InSP) layers 404 in cavities between the channels 208 prior to formation of the source/drain regions 210 in the source/drain recesses 402. The inner spacer layers 404 are included to provide increased isolation between the gate structures 212 (e.g., the replacement gate structures) and the source/drain regions 210 that are to be formed in the source/drain recesses 402 for reduced parasitic capacitance. The inner spacer layers 404 include a silicon nitride ($Si_xN_y$), a silicon oxide ($SiO_x$), a silicon oxynitride (SiON), a silicon oxycarbide (SiOC), a silicon carbon nitride (SiCN), a silicon oxycarbonnitride (SiOCN), and/or another dielectric material. The inner spacer layers 404 and the spacer layers 342 may be formed of the same material or of different materials.

The inner spacer layers 404 may be formed by etching (e.g., by the etch tool 108) the ends of the first layers 304 to form cavities between adjacent nanostructure channels 208. The etching also results in removal of the remaining portions of the cladding sidewall layers 326 in the source/drain recesses 402 (e.g., because the cladding sidewall layers 326 and the first layers 304 are formed of the same material). The etch tool 108 may laterally etch (e.g., in a direction that is approximately parallel to a length of the first layers 304) the first layers 304 in an etch operation, thereby forming the cavities (or recesses) between portions of the channels 208. In implementations where the first layers 304 are silicon germanium (SiGe) and the second layers 306 are silicon (Si), the etch tool 108 may selectively etch the first layers 304 using a wet etchant such as, a mixed solution including hydrogen peroxide ($H_2O_2$), acetic acid ($CH_3COOH$), and/or hydrogen fluoride (HF), followed by a cleaning with water ($H_2O$). The mixed solution and the wafer may be provided into the source/drain recesses 402 to etch the first layers 304 from the source/drain recesses 402. In some implementations, the etching by the mixed solution and cleaning by water is repeated approximately 10 times to approximately 20 times. The etching time by the mixed solution is in a range from about 1 minute to about 2 minutes in some implementations. The mixed solution may be used at a temperature in a range of approximately 60° Celsius to approximately 90° Celsius. However, other values for the parameters of the etch operation are within the scope of the present disclosure. The inner spacers layers 404 are then formed on the ends of the first layers 304 in the cavities. In some implementations, a conformal layer is deposited (e.g., by the deposition tool 102) in the source/drain recesses 402, and the etch tool 108 removes excess material of the conformal layer to form the inner spacer layers 404.

Figure 4D:
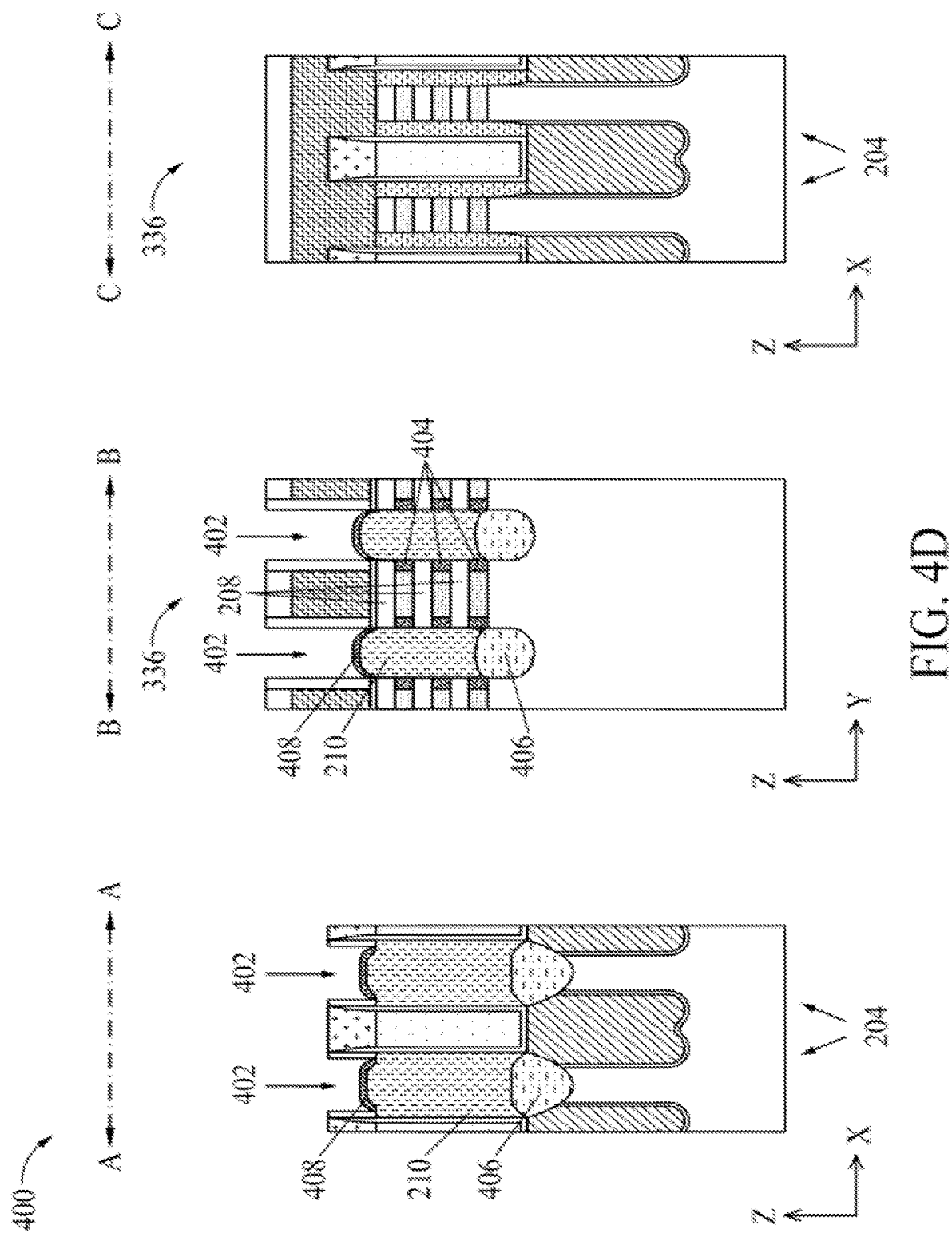

As shown in the cross-sectional plane A-A and the cross-sectional plane B-B in FIG. 4D, the source/drain recesses 402 are filled with one or more layers to form the source/drain regions 210 in the source/drain recesses 402. For example, the deposition tool 102 may deposit a buffer layer 406 at the bottom of the source/drain recesses 402, the deposition tool 102 may deposit the source/drain regions 210 on the buffer layer 406, and the deposition tool 102 may deposit a capping layer 408 on the source/drain regions 210. The buffer layer 406 may include silicon (Si), silicon doped with boron (SiB) or another dopant, and/or another material. The buffer layer 406 may be included to control the proximity and/or shape of the source/drain regions 210.

The source/drain regions 210 may include one or more layers of epitaxially grown material. For example, the deposition tool 102 may epitaxially grow a first layer of the source/drain regions 210 (referred to as an L1) over the buffer layer 406, and may epitaxially grow a second layer of the source/drain regions 210 (referred to as an L2, an L2-1, and/or an L2-2) over the first layer. The first layer may include a lightly doped silicon (e.g., doped with boron (B), phosphorous (P), and/or another dopant), and may be included as shielding layer to reduce short channel effects in the semiconductor device 200 and to reduce dopant extrusion into the channels 208. The second layer may include a highly doped silicon or highly doped silicon germanium. The second layer may be included to provide a compressive stress in the source/drain regions 210 to reduce boron loss.

The capping layer 408 may include silicon, silicon germanium, doped silicon, doped silicon germanium, and/or another material. The capping layer 408 may be included to reduce dopant diffusion and to protect the source/drain regions 210 in subsequent semiconductor processing operations for the semiconductor device 200 prior to contact formation.

As indicated above, the number and arrangement of operations and devices shown in FIGS. 4A-4D are provided as one or more examples. In practice, there may be additional operations and devices, fewer operations and devices, different operations and devices, or differently arranged operations and devices than those shown in FIGS. 4A-4D.

FIGS. 5A-5D are diagrams of an example implementation 500 described herein. The example implementation 500 includes an example of a replacement gate process (RPG) for replacing the dummy gate structures 336 with the gate structures 212 (e.g., the replacement gate structures) of the semiconductor device 200. FIGS. 5A-5D are illustrated from a plurality of perspectives illustrated in FIG. 3U, including the perspective of the cross-sectional plane A-A in FIG. 3U, the perspective of the cross-sectional plane B-B in FIG. 3U, and the perspective of the cross-sectional plane C-C in FIG. 3U. In some implementations, the operations described in connection with the example implementation 500 are performed after the operations described in connection with FIGS. 3A-3U and/or after the operations described in connection with FIGS. 4A-4D.

Figure 5A:
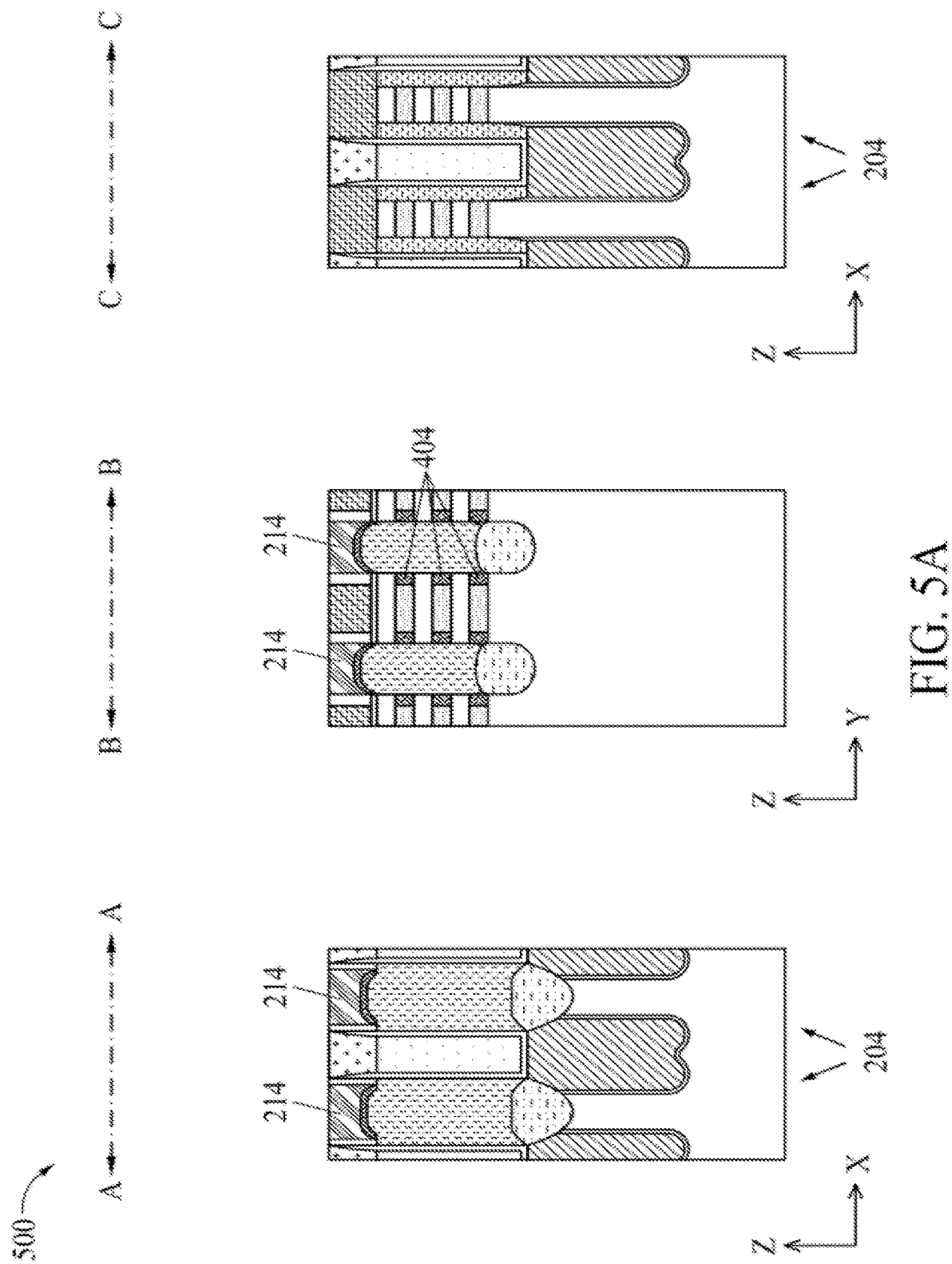

As shown in the cross-sectional plane A-A and the cross-sectional plane B-B in FIG. 5A, the dielectric layer 214 is formed over the source/drain regions 210. The dielectric layer 214 fills in areas between the dummy gate structures 336, between the hybrid fin structures 334, and over the source/drain regions 210. The dielectric layer 214 is formed to reduce the likelihood of and/or prevent damage to the source/drain regions 210 during the replacement gate process. The dielectric layer 214 may be referred to as an interlayer dielectric (ILD) zero (ILD0) layer or another ILD layer.

In some implementations, a contact etch stop layer (CESL) is conformally deposited (e.g., by the deposition tool 102) over the source/drain regions 210, over the dummy gate structures 336, and on the spacer layers 342 prior to formation of the dielectric layer 214. The dielectric layer 214 is then formed on the CESL. The CESL may provide a mechanism to stop an etch process when forming contacts or vias for the source/drain regions 210. The CESL may be formed of a dielectric material having a different etch selectivity from adjacent layers or components. The CESL may include or may be a nitrogen containing material, a silicon containing material, and/or a carbon containing material. Furthermore, the CESL may include or may be silicon nitride ($Si_xN_y$), silicon carbon nitride (SiCN), carbon nitride (CN), silicon oxynitride (SiON), silicon carbon oxide (SiCO), or a combination thereof, among other examples. The CESL may be deposited using a deposition process, such as ALD, CVD, or another deposition technique.

Figure 5B:
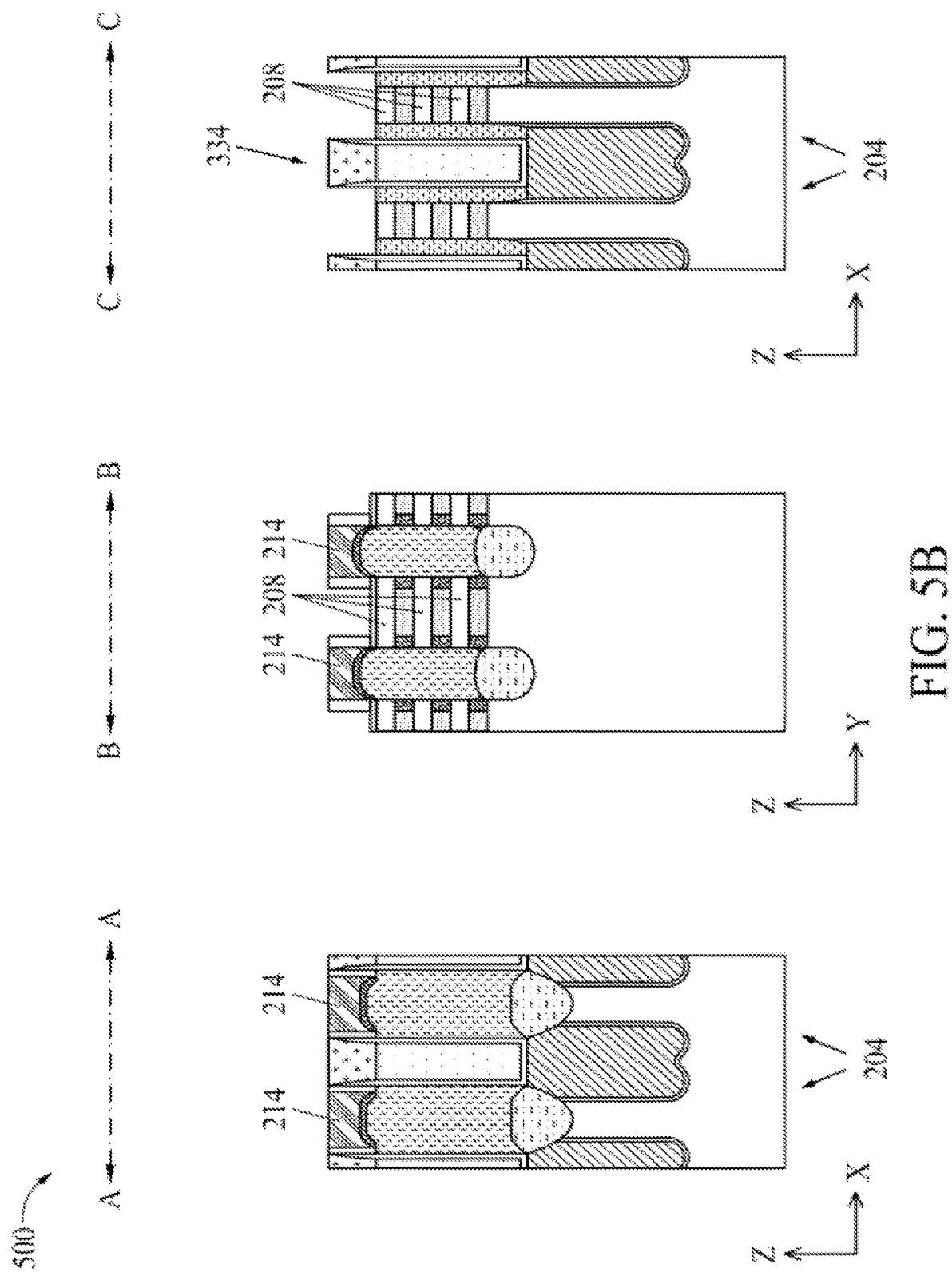

As shown in the cross-sectional plane B-B and the cross-sectional plane C-C in FIG. 5B, the replacement gate operation is performed (e.g., by one or more of the semi-conductor processing tools 102-112) to remove the dummy gate structures 336 from the semiconductor device 200. The removal of the dummy gate structures 336 leaves behind openings (or recesses) between the dielectric layer 214 over the source/drain regions 210, and between the hybrid fin structures 334 over the fin structures 204. The dummy gate structures 336 may be removed in one or more etch operations. Such etch operations may include a plasma etch technique, a wet chemical etch technique, and/or another type of etch technique.

Figure 5C:
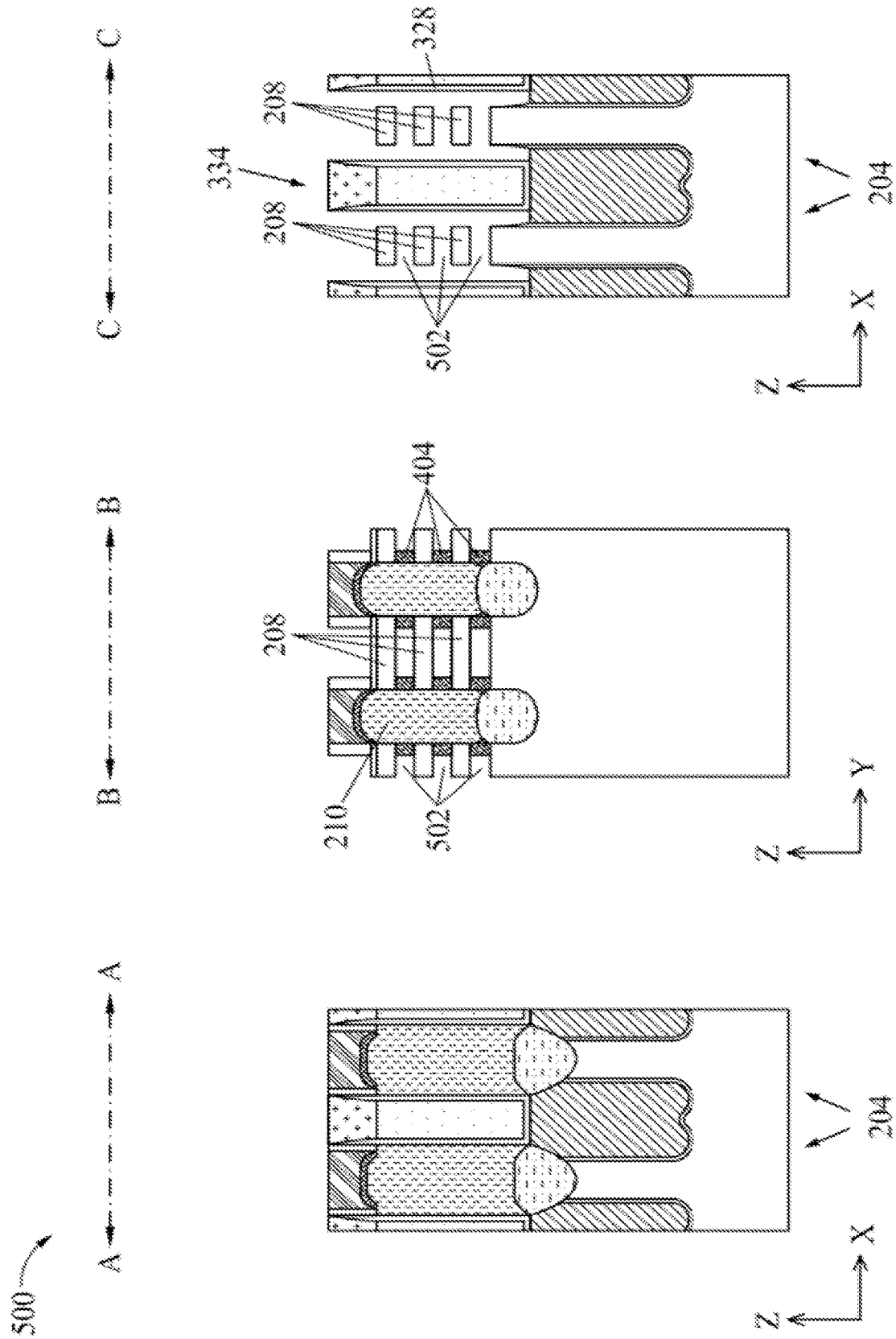

As shown in the cross-sectional plane B-B and the cross-sectional plane C-C in FIG. 5C, a nanostructure release operation is performed to remove the first layers 304 (e.g., the silicon germanium layers). This results in openings 502 between the channels 208 (e.g., the areas around the channels 208). The nanostructure release operation may include the etch tool 108 performing an etch operation to remove the first layer 304 based on a difference in etch selectivity between the material of the first layers 304 and the material of the channels 208, and between the material of the first layers 304 and the material of the inner spacer layers 404. The inner spacer layers 404 may function as etch stop layers in the etch operation to protect the source/drain regions 210 from being etched. As further shown in FIG. 5C, the cladding layers 326 are removed in the nanostructure release operation. This provides access to the areas around the nanostructure channels 208, which enable replacement gate structures (e.g., the gate structures 212) to be formed fully around the nanostructure channels 208.

Figure 5D:
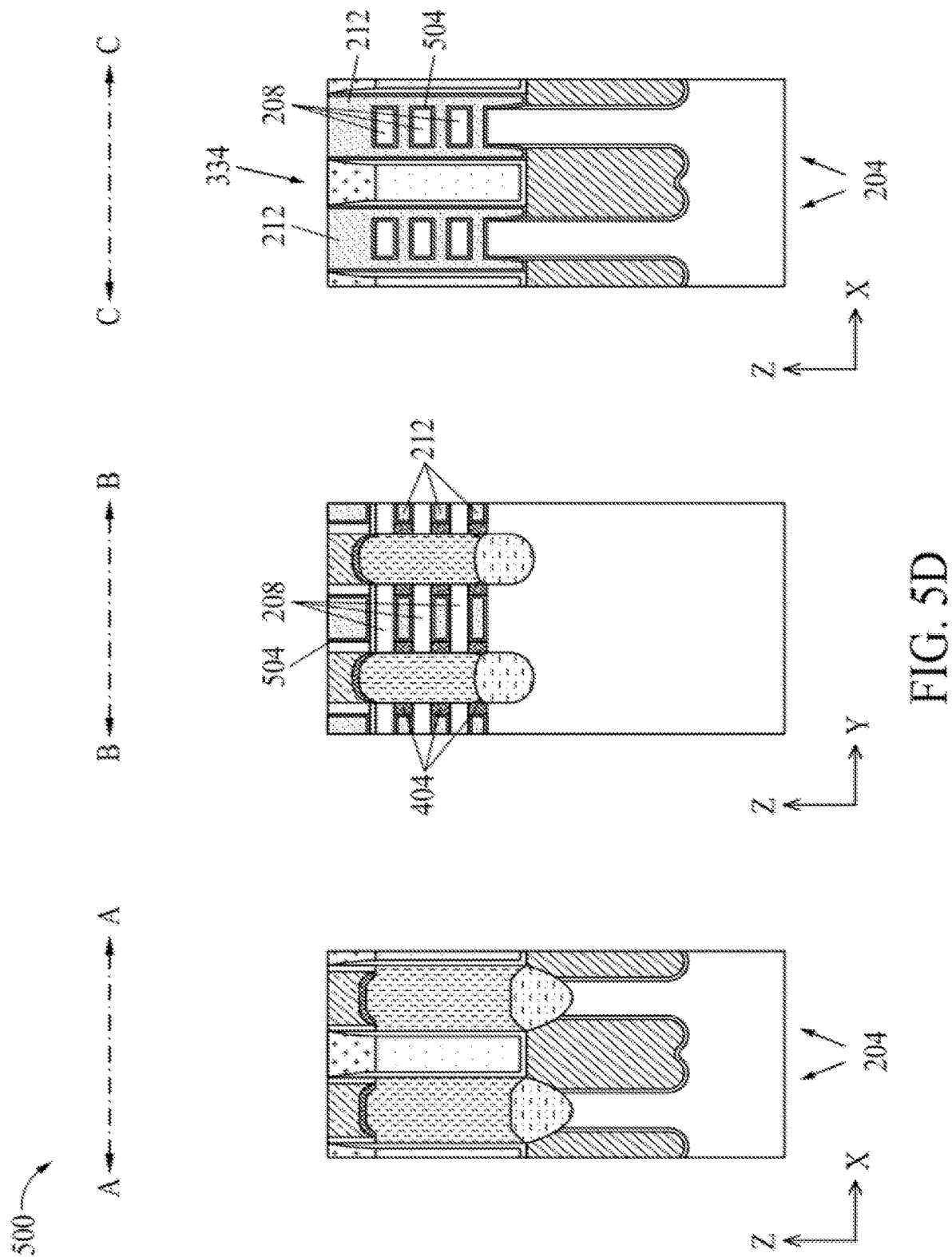

As shown in the cross-sectional plan B-B and the cross-sectional plane C-C in FIG. 5D, the replacement gate operation continues where deposition tool 102 and/or the plating tool 112 forms the gate structures (e.g., replacement gate structures) 212 in the openings 502 between the source/drain regions 210 and between the hybrid fin structures 334. In particular, the gate structures 212 fill the areas between and around the channels 208 that were previously occupied by the first layers 304 and the cladding sidewall layers 326 such that the gate structures 212 surround the channels 208. The gate structures 212 may include metal gate structures. A conformal high-k dielectric liner 504 may be deposited onto the channels 208 and on sidewalls prior to formation of the gate structures 212. The gate structures 212 may include additional layers such as an interfacial layer, a work function tuning layer, and/or a metal electrode structure, among other examples.

As further shown in the cross-sectional plane C-C in FIG. 5D, the removal of the cladding layer 324 from the tops of the STI regions 206 to prevent the cladding sidewall layers 326 from including footings under the hybrid fin structure 334 between adjacent fin structures 204 enables the gate structures 212 to be formed such that the gate structure 212 does not include a footing under the hybrid fin structure 334. In other words, since the gate structures 212 are formed in the areas that were previously occupied by the cladding sidewall layers 326, the absence of a footing under the hybrid fin structure 334 for the cladding sidewall layers 326 also results in an absence of a footing under the hybrid fin structure 334 for the gate structures 212. This reduces and/or prevents shorting between the gate structures 212 and the source/drain regions 210 under the hybrid fin structures 212. Furthermore, and as shown in the cross-sectional plane C-C in FIG. 5D, the hybrid fin structure 334 is between nanostructures (e.g., channels 208) of adjacent structures 204.

As indicated above, the number and arrangement of operations and devices shown in FIGS. 5A-5D are provided as one or more examples. In practice, there may be additional operations and devices, fewer operations and devices, different operations and devices, or differently arranged operations and devices than those shown in FIGS. 5A-5D.

FIG. 6 is a diagram of an example implementation 600 described herein. The example implementation 600 includes a cladding sidewall layer configuration for the fin structure 204a (e.g., a PMOS fin structure) and the fin structure 204b (e.g., an NMOS fin structure). The fin structure 204a and the fin structure 204b can be formed using a combination of one or more operations described in connection with FIGS. 3A-3U and/or elsewhere herein.

The example implementation 600 is illustrated from the perspective of the cross-sectional plane C-C in FIG. 3U. As shown in the cross-sectional plane C-C in FIG. 6, the fin structure 204a and the fin structure 204b are over the semiconductor substrate 202. Furthermore, the fin structure 204b is adjacent to the fin structure 204a. The STI region 206 is between the fin structure 204a and the fin structure 204b.

The fin structure 204a includes the cladding sidewall layer 326a along a sidewall of the fin structure 204a. The cladding sidewall layer 326a includes a bottom edge 602a and faces the second fin structure 204b.

The fin structure 204b includes the cladding sidewall layer 326b along a sidewall of the fin structure 204b. The cladding sidewall layer 326b includes the bottom edge 602b and faces the fin structure 204a.

Note that the example implementation 600 illustrated in FIG. 6 an intermediate structure in the formation of the semiconductor device 200. The cladding sidewall layers 326a and 326b are replaced with the gate structures 212 of the semiconductor device 200 in the final structure of the semiconductor device 200. Accordingly, while the example implementation 600 is illustrated and described in connection with the cladding sidewall layers 326a and 326b, the dimensions and other properties described for the cladding sidewall layers 326a and 326b are the same or similar for the gate structures 212 that replace the cladding sidewall layers 326a and 326b. In other words, the dimensions and other properties of the sidewalls of the gate structures 212 can be considered to be the same or similar as the dimensions and other properties described for the cladding sidewall layers 326a and 326b in FIG. 6.

In some implementations, lengths associated with the cladding sidewall layer 326b and the cladding sidewall layer 326a are asymmetric. For example, and as shown in FIG. 6, the bottom edge 602b is lower relative to the bottom edge 602a. In combination with chemisorption and/or physisorption described in connection with FIG. 3H, one or more processes described in connection with FIGS. 3A-3J (e.g., etching of the dielectric layer 322, deposition of the cladding sidewall layers 326, or etching of the cladding sidewall layers 326, among other examples) may be performed specifically to cause the bottom edge 602b to be lower than the bottom edge 602a.

In some implementations, a depth d of the bottom edge 602b of the cladding sidewall layer 326b is in a range of approximately 8 nanometers to approximately 15 nanometers below a top surface 614 of a mesa region of the semiconductor substrate 202 (e.g., top surfaces of the portions 318 of the fin structures 204a and 204b). Furthermore, the bottom edges 602a and 602b are located below the top surface 614. If the depth 610 is less than this range, the cladding sidewall layer 326b may be over-etched and cause a length of the cladding sidewall layer 326b to be shortened, which can result in insufficient coverage of the lower nanostructure channels of the semiconductor device 200 by a gate structure 212 that replaces the cladding sidewall layer 326b. If the depth 610 is greater than this range, the cladding sidewall layer 326b may be under-etched and cause a footing to form over the STI region 206, which increases a likelihood of electrical shorting because a gate structure 212 that replaces the cladding sidewall layer 326b may also have a footing under the hybrid fin structure 334. However, other ranges and values for the depth 610 are within the scope of the present disclosure.

In some implementations, depth 612 of the bottom edge 602a of the cladding sidewall layer 326a is in a range of approximately 4 nanometers to approximately 6 nanometers below the top surface 614 of the region of the semiconductor substrate 202. If the depth 612 is less than this range, the cladding sidewall layer 326a may be over-etched and cause a length of the cladding sidewall layer 326a to be shortened, which can result in insufficient coverage of the lower nanostructure channels of the semiconductor device 200 by a gate structure 212 that replaces the cladding sidewall layer 326a. If the depth 612 is greater than this range, the cladding sidewall layer 326a may be under-etched and cause a footing to form over the STI region 206, which increases a likelihood of electrical shorting because a gate structure 212 that replaces the cladding sidewall layer 326b may also have a footing under the hybrid fin structure 334. However, other ranges and values for the depth 612 are within the scope of the present disclosure.

In some implementations, a ratio of the depth 610 of the bottom edge 602b to the depth 612 of the bottom edge 602a is in a range of approximately 4:3 to approximately 4:1. If the ratio is less than this range, one or more of the cladding sidewall layers 326a or 326b may be over-etched. If the ratio is greater than this range, one or more of the cladding sidewall layers 326a or 326b may be under-etched and cause a footing to form over the STI region 206. However, other ranges and values for the ratio are within the scope of the present disclosure.

In some implementations, and as shown, the fin structure 204a includes a portion 316a of a layer stack (e.g., the layer stack 302). In some implementations, and as shown, the fin structure 204b includes the portion 316b of the layer stack. The portion 316a of the layer stack includes a plurality of alternating layers (e.g., the plurality of the first layers 304 alternating with the plurality of the second layers 306). The portion 316b of the layer stack also includes the plurality of alternating layers (e.g., the plurality of the first layers 304 alternating with the plurality of the second layers 306). As indicated above, FIG. 6 is provided as an example. Other examples may differ from what is described with regard to FIG. 6.

FIGS. 7A and 7B are diagrams of an example implementation 700 described herein. The example implementation 700 includes a plurality of examples of different cladding sidewall layer configurations (e.g., different lengths, different angles, different bottom edge depths) for different configurations of fin structures 204. The example implementation 700 is illustrated from the perspective of the cross-sectional plane C-C of FIG. 3U. The example implementation 700 includes the fin structure 204a1, the fin structure 204a2, the fin structure 204b1, and the fin structure 204b2. The fin structure 204a1, the fin structure 204a2, the fin structure 204b1, and the fin structure 204b2 may be formed over the semiconductor substrate 202 using a combination of one or more operations described in connection with FIGS. 3A-3U and elsewhere herein.

Turning to FIG. 7A, in some implementations, the fin structure 204a1 includes a PMOS fin structure. The fin structure 204a1 includes the cladding sidewall layer 326c along a sidewall of the fin structure 204a1. The cladding sidewall layer 326c faces the dielectric layer 330a between the fin structure 204a1 and the fin structure 204a2 (e.g., another PMOS fin structure). The cladding sidewall layer 326c includes the bottom edge 604c.

The fin structure 204a1 also includes the cladding sidewall layer 326d along an opposing sidewall. The cladding sidewall layer 326d faces the dielectric layer 330b between the fin structure 204a1 and the fin structure 204b1 (e.g., an NMOS fin structure). The cladding sidewall layer 326d includes the bottom edge 604d. As shown in FIG. 7A, a vertical location of the bottom edge 604d is lower than a vertical location of the bottom edge 604c.

In some implementations, lengths and/or angles associated with the cladding sidewall layer 326c and the cladding sidewall layer 326d are asymmetric. For example, a length 702 of the cladding sidewall layer 326c may be less relative to a length 704 of the cladding sidewall layer 326d in a range from approximately 2 nanometers to approximately 5 nanometers. If the difference between the lengths 702 and 704 is less than this range, the cladding sidewall layer 326 may be over-etched. If the difference between the lengths 702 and 704 is greater than this range, a footing may remain over the STI region 206a and/or the STI region 206b. However, other ranges and values for the difference between the length 702 and the length 704 are within the scope of the present disclosure.

As another example, an angle 706 between a sidewall of the cladding sidewall layer 326c and the bottom edge 604c of the cladding sidewall layer 326c may be greater relative to an angle 708 between a sidewall of the cladding sidewall layer 326d and the bottom edge 604d of the cladding sidewall layer 326d. The angle 706 may be greater than the angle 708 in a range from approximately 6 degrees to 15 degrees. If the difference between the angles 706 and 708 is less than this range, the STI region 206a and/or the STI region 206b may be under-etched. If difference between the angles 706 and 708 is greater than this range, STI region 206a and/or STI region 206b may be over-etched. However, other ranges and values for the difference between the angles 706 and 708 are within the scope of the present disclosure.

Note that the example illustrated in FIG. 7A is an intermediate structure in the formation of the semiconductor device 200. The cladding sidewall layers 326c and 326d are replaced with the gate structures 212 of the semiconductor device 200 in the final structure of the semiconductor device 200. Accordingly, while the example in FIG. 7A is illustrated and described in connection with the cladding sidewall layers 326c and 326d, the dimensions and other properties described for the cladding sidewall layers 326c and 326c are the same or similar for the gate structures 212 (e.g., the sidewalls of the gate structures 212) that replace the cladding sidewall layers 326c and 326d. In other words, the dimensions and other properties of the sidewalls of the gate structures 212 can be considered to be the same or similar as the dimensions and other properties described for the cladding sidewall layers 326c and 326d in FIG. 7A.

Turning to FIG. 7B, in some implementations, the fin structure 204b1 includes an NMOS fin structure. The fin structure 204b1 includes the cladding sidewall layer 326e along a sidewall of the fin structure 204b1. The cladding sidewall layer 326e also includes the bottom edge 604e.

The fin structure 204b1 also includes the cladding sidewall layer 326f along an opposing sidewall. The cladding sidewall layer 326f faces the dielectric layer 330b between the fin structure 204b1 and the fin structure 204a1 (e.g., a PMOS fin). The cladding sidewall layer 326f also includes the bottom edge 604f. A vertical location of the bottom edge 604f is lower than a vertical location of the bottom edge 604e.

In some implementations, lengths and/or angles associated with the cladding sidewall layer 326e and the cladding sidewall layer 326f are asymmetric. For example, a length 710 of the cladding sidewall layer 326e may be less relative to a length 712 of the cladding sidewall layer 326f in a range from approximately 2 nanometers to approximately 5 nanometers. If the difference between the lengths 710 and 712 is less than this range, the cladding sidewall layer 326 may be over-etched to cause a length of the cladding sidewall layer 326e and/or the cladding sidewall layer 326f to be shortened. If the difference between the lengths 710 and 712 is greater than this range, the cladding sidewall layer 326 may be under-etched. However, other ranges and values for difference between the length 710 and the length 712 are within the scope of the present disclosure.

Note that the example illustrated in FIG. 7B is an intermediate structure in the formation of the semiconductor device 200. The cladding sidewall layers 326e and 326f are replaced with the gate structures 212 of the semiconductor device 200 in the final structure of the semiconductor device 200. Accordingly, while the example in FIG. 7B is illustrated and described in connection with the cladding sidewall layers 326e and 326f, the dimensions and other properties described for the cladding sidewall layers 326e and 326f are the same or similar for the gate structures 212 (e.g., the sidewalls of the gate structures 212) that replace the cladding sidewall layers 326e and 326f. In other words, the dimensions and other properties of the sidewalls of the gate structures 212 can be considered to be the same or similar as the dimensions and other properties described for the cladding sidewall layers 326e and 326f in FIG. 7B.

As indicated above, FIGS. 7A and 7B are provided as examples. Other examples may differ from what is described with regard to FIGS. 7A and 7B.

Figure 8:
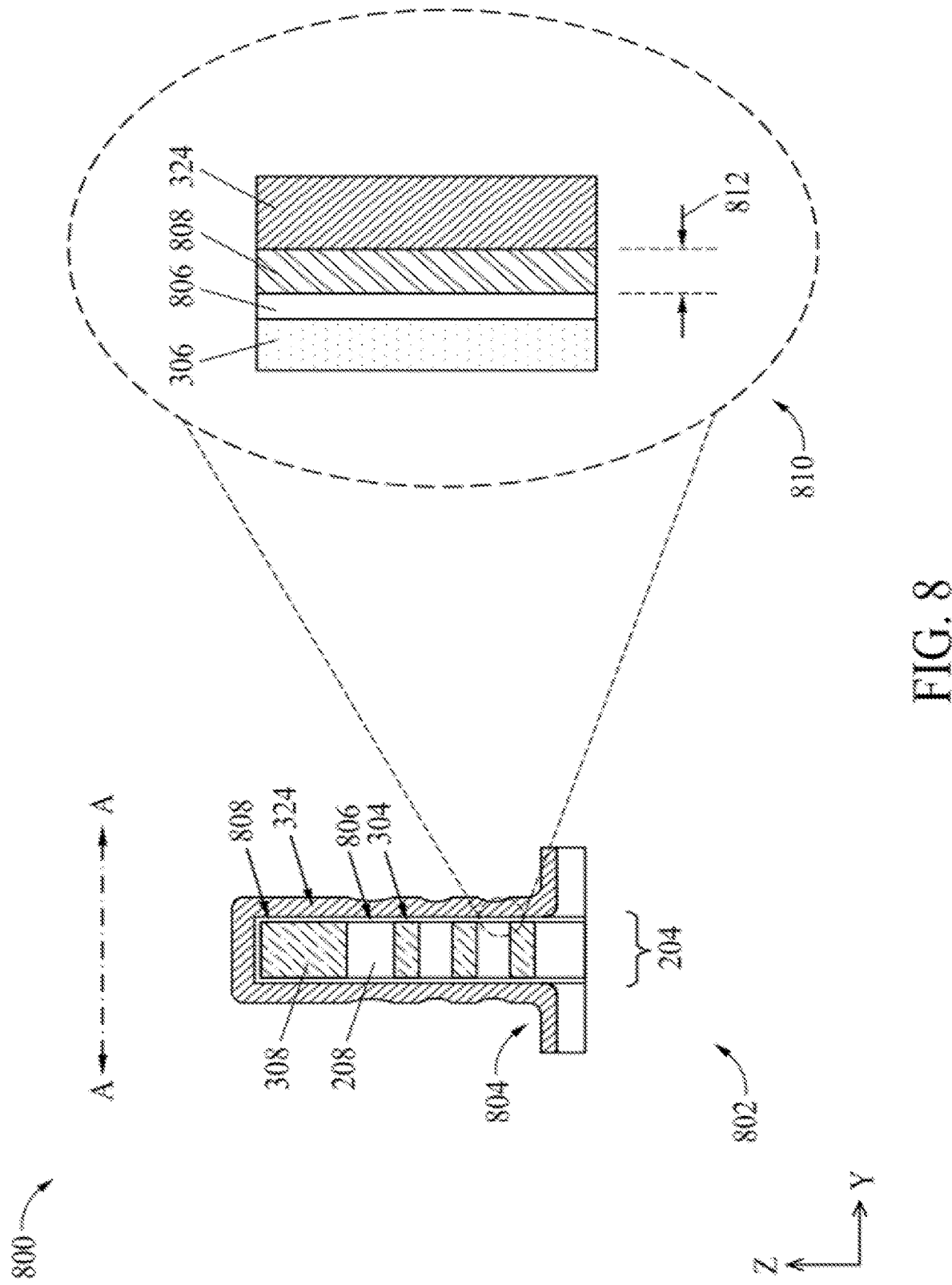

FIG. 8 is a diagram of an example implementation 800 described herein. The example implementation 800 is illustrated from the perspective of the cross-sectional plane A-A of FIG. 3J. In the implementation 800, the fin structure 204 includes the cladding layer 324. The fin structure 204 includes the plurality of first layers 304, the plurality of channels 208, and the hard mask layer 308. The fin structure 204 also includes a base region 804 (e.g., region at a base of the fin structure 204 that is near or over the STI region 206). The fin structure 204 is shown after deposition of the cladding layer 324 and prior to etching the cladding layer 324 to form the cladding sidewall layers 326. The fin structure 204 also includes an oxide layer 806 and a seed layer 808 between sidewalls of the fin structure 204 and the cladding layer 324. In some implementations, the oxide layer 806 includes a native oxide growth that is approximately 1 nanometer thick. However, the oxide layer 806 may include a native oxide growth of another thickness.

As shown in the magnified view of example 810, the seed layer 808 may have a thickness 812. The seed layer 808 may be deposited using one or more operations or parameters as described in connection with FIGS. 3I and 3J. For example, operations may include depositing the seed layer 808 using a nitrogen ($N_2$) carrier gas. Additionally, or alternatively, operations may include using disilane ($Si_2H_6$) as a silicon precursor. Using a disilane silicon precursor may cause the thickness 812 of the seed layer 808 on sides of the plurality second layers 306 (e.g., S1 layers) to be thinner relative to the thickness 812 on the sides of the plurality of first layers 304 (e.g., SiGe layers). As described in connection with FIGS. 3I and 3J, the thickness 812 may range from approximately 0.5 nanometers to approximately 1.5 nanometers. This may, as shown in example 802, cause a "wavy" profile of the cladding layer 324.

In some implementations, and as described in connection with FIGS. 3I and 3J, the seed layer 808 is deposited at a first pressure (e.g., approximately 30 torr to approximately 100 torr) and the cladding layer 324 is deposited at a second pressure (e.g., approximately 5 torr to approximately 20 torr) that is lesser relative to the first pressure. However, the cladding layer 324 may include other combinations of materials and/or thicknesses. This difference in pressure may reduce a likelihood of forming protrusions of the cladding layer 324 (e.g., an overhang protruding from the hard mask layer 308 or a footing protruding from the base region 804, among other examples). In some implementations, the cladding layer 324 may include an amorphous silicon germanium (a-SiGe) material that is approximately 10 nanometers thick.

As indicated above, FIG. 8 is provided as an example. Other examples may differ from what is described with regard to FIG. 8.

Figure 9:
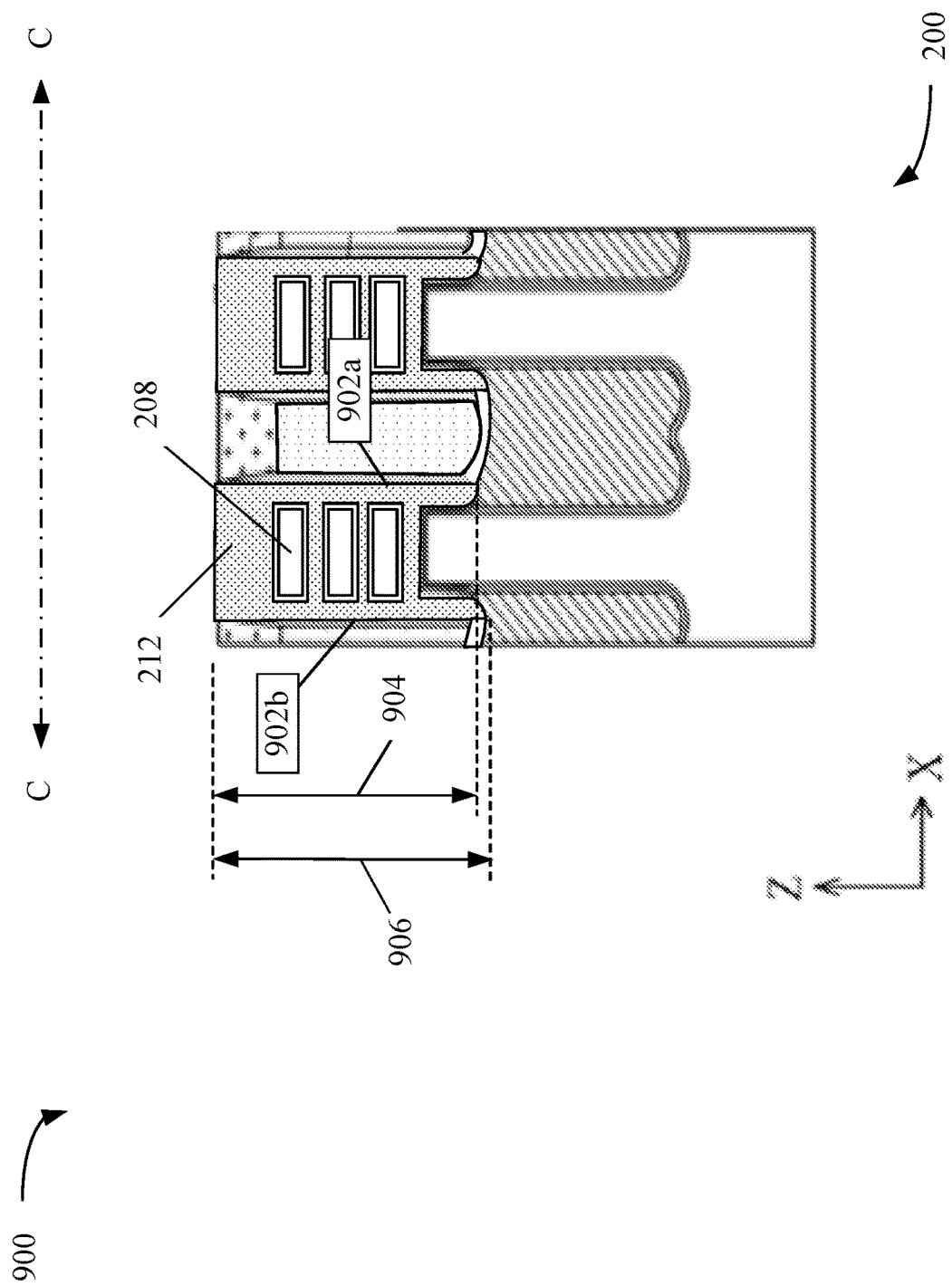

FIG. 9 a diagram of an example implementation 900 described herein. The example implementation 900 shows the semiconductor device 200 after the replacement gate operation as described in connection with FIG. 5D and elsewhere herein. The example implementation 900 is illustrated from the perspective of the cross-sectional plane C-C in FIG. 3U.

As shown in the cross-sectional plane C-C in FIG. 9, The semiconductor device 200 may include a plurality of nanostructures (e.g., a plurality of the channels 208) arranged along a direction perpendicular to a substrate. The semiconductor device 200 includes the gate structure 212 wrapping around each of the plurality of nanostructures.

As shown, the gate structure 212 includes a first sidewall 902a along a first side of the plurality of nanostructures. In some implementations, the first sidewall 902a includes a first bottom edge a first vertical location (e.g., a first bottom edge at a first depth 904). The gate structure further includes a second sidewall 902b along a second side of the plurality of nanostructures opposing the first side. In some implementations, the second sidewall 902b includes a second bottom edge at a second vertical location (e.g., a second bottom edge at a second depth 906). In some implementations, and as shown in FIG. 9, the second vertical location is lower relative to the first vertical location of the first bottom edge.

In some implementations, sidewalls of the gate structure 212 (e.g., the first sidewall 902a and/or the second sidewall 902b) may include one or more dimensional properties corresponding to values and ranges of a previously formed cladding sidewall layer (e.g., one or more of the cladding sidewall layers 326a-326f). As an example, bottom edges of sidewalls 902a and/or 902b may include depths corresponding to values and ranges for the depths 610 and/or 612. Additionally, or alternatively, lengths of the sidewalls 902a and/or 902b may be asymmetric and include lengths corresponding to values and ranges for the lengths 702, 704, 710, or 712 as described herein. Additionally, or alternatively, bottom edges of the sidewalls 902a and/or 902b may include angles corresponding to values and ranges for the angles 706 and/or 708 as described herein.

As indicated above, FIG. 9 is provided as an example. Other examples may differ from what is described with regard to FIG. 9.

Figure 10:
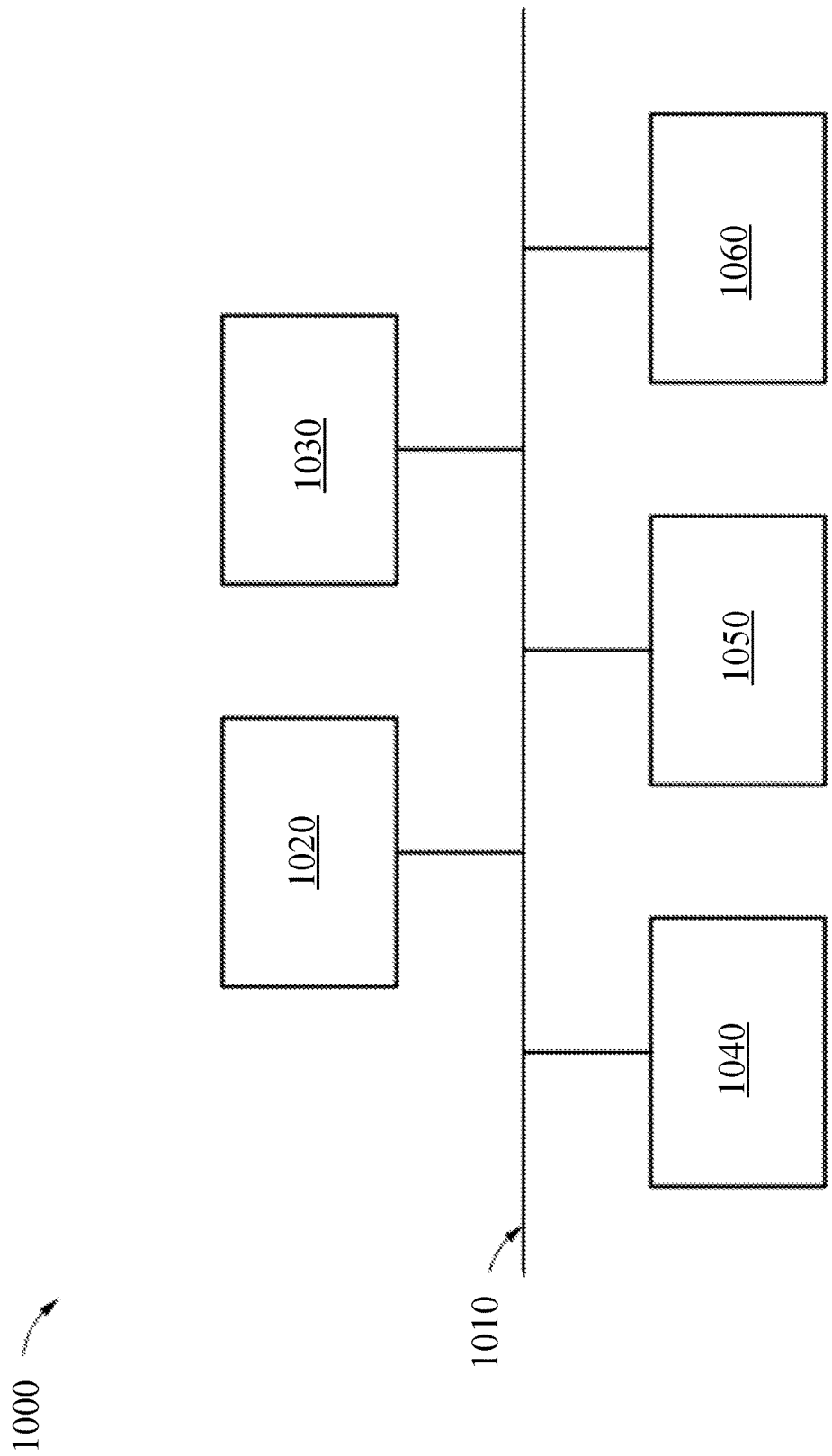
FIG. 10 is a diagram of example components of one or more devices of FIG. 1 described herein.

FIG. 10 is a diagram of example components of a device 1000. In some implementations, one or more of the semiconductor processing devices 102-112 and/or the wafer/die transport tool 114 may include one or more devices 1000 and/or one or more components of device 1000. As shown in FIG. 10, device 1000 may include a bus 1010, a processor 1020, a memory 1030, an input component 1040, an output component 1050, and a communication component 1060.

Bus 1010 includes one or more components that enable wired and/or wireless communication among the components of device 1000. Bus 1010 may couple together two or more components of FIG. 10, such as via operative coupling, communicative coupling, electronic coupling, and/or electric coupling. Processor 1020 includes a central processing unit, a graphics processing unit, a microprocessor, a controller, a microcontroller, a digital signal processor, a field-programmable gate array, an application-specific integrated circuit, and/or another type of processing component. Processor 1020 is implemented in hardware, firmware, or a combination of hardware and software. In some implementations, processor 1020 includes one or more processors capable of being programmed to perform one or more operations or processes described elsewhere herein.

Memory 1030 includes volatile and/or nonvolatile memory. For example, memory 1030 may include random access memory (RAM), read only memory (ROM), a hard disk drive, and/or another type of memory (e.g., a flash memory, a magnetic memory, and/or an optical memory). Memory 1030 may include internal memory (e.g., RAM, ROM, or a hard disk drive) and/or removable memory (e.g., removable via a universal serial bus connection). Memory 1030 may be a non-transitory computer-readable medium. Memory 1030 stores information, instructions, and/or software (e.g., one or more software applications) related to the operation of device 1000. In some implementations, memory 1030 includes one or more memories that are coupled to one or more processors (e.g., processor 1020), such as via bus 1010.

Input component 1040 enables device 1000 to receive input, such as user input and/or sensed input. For example, input component 1040 may include a touch screen, a keyboard, a keypad, a mouse, a button, a microphone, a switch, a sensor, a global positioning system sensor, an accelerometer, a gyroscope, and/or an actuator. Output component 1050 enables device 1000 to provide output, such as via a display, a speaker, and/or a light-emitting diode. Communication component 1060 enables device 1000 to communicate with other devices via a wired connection and/or a wireless connection. For example, communication component 1060 may include a receiver, a transmitter, a transceiver, a modem, a network interface card, and/or an antenna.

Device 1000 may perform one or more operations or processes described herein. For example, a non-transitory computer-readable medium (e.g., memory 1030) may store a set of instructions (e.g., one or more instructions or code) for execution by processor 1020. Processor 1020 may execute the set of instructions to perform one or more operations or processes described herein. In some implementations, execution of the set of instructions, by one or more processors 1020, causes the one or more processors 1020 and/or the device 1000 to perform one or more operations or processes described herein. In some implementations, hardwired circuitry is used instead of or in combination with the instructions to perform one or more operations or processes described herein. Additionally, or alternatively, processor 1020 may be configured to perform one or more operations or processes described herein. Thus, implementations described herein are not limited to any specific combination of hardware circuitry and software.

The number and arrangement of components shown in FIG. 1000 are provided as an example. Device 1000 may include additional components, fewer components, different components, or differently arranged components than those shown in FIG. 10. Additionally, or alternatively, a set of components (e.g., one or more components) of device 1000 may perform one or more functions described as being performed by another set of components of device 1000.

Figure 11:
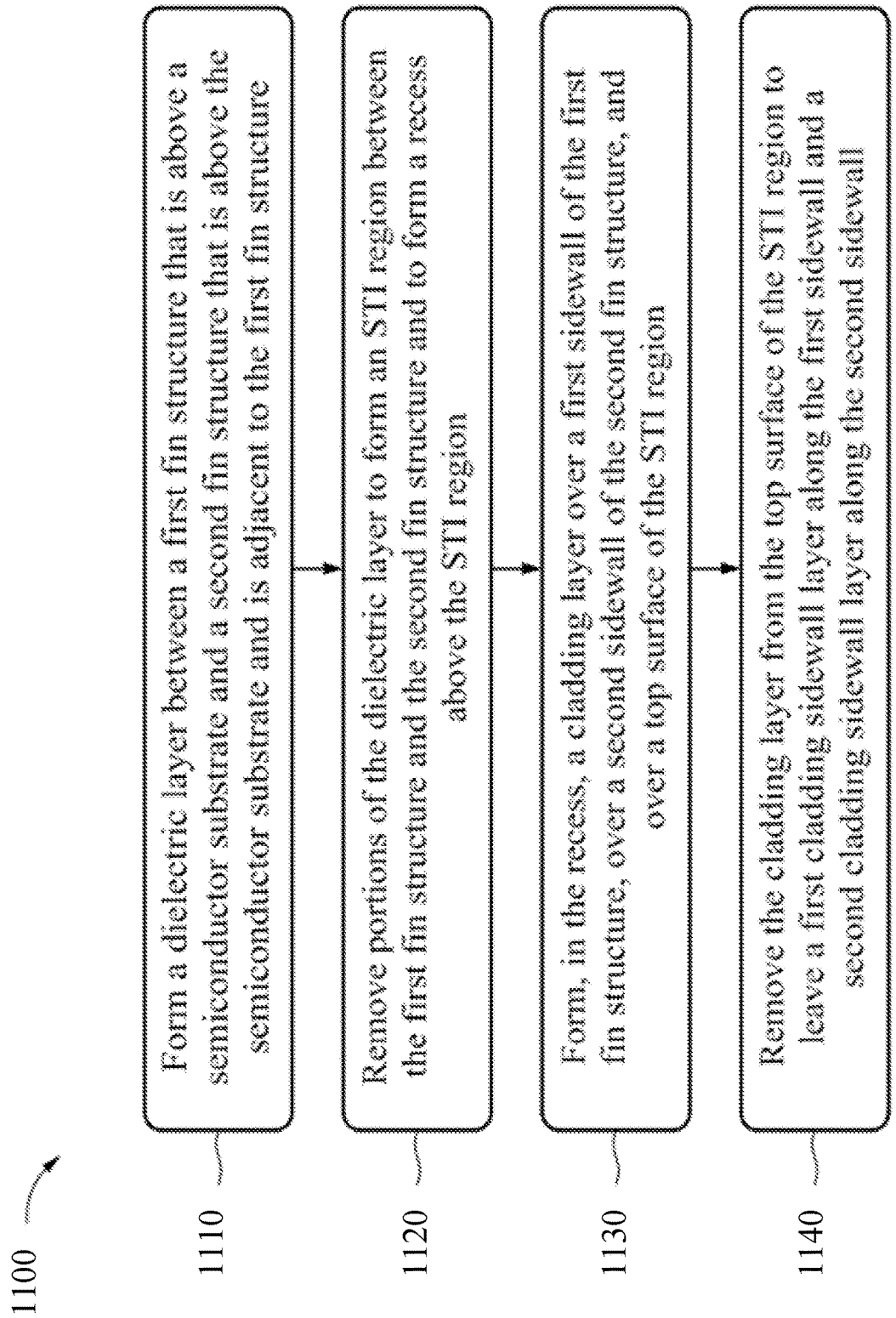
FIG. 11 is a flowchart of an example process associated with forming a semiconductor device described herein.

FIG. 11 is a flowchart of an example process 1100 associated with forming a semiconductor device. In some implementations, one or more process blocks of FIG. 11 are performed by one or more semiconductor processing tools (e.g., one or more of the semiconductor processing tools 102-112). Additionally, or alternatively, one or more process blocks of FIG. 11 may be performed by one or more components of device 1000, such as processor 1020, memory 1030, input component 1040, output component 1050, and/or communication component 1060.

As shown in FIG. 11, process 1100 may include forming a dielectric layer between a first fin structure that is above a semiconductor substrate and a second fin structure that is above the semiconductor substrate and is adjacent to the first fin structure (block 1110). For example, one or more of the semiconductor processing tools 102-112 may form a dielectric layer 322 between a first fin structure 204a that is above a semiconductor substrate and a second fin structure 204b that is above the semiconductor substrate and is adjacent to the first fin structure, as described above.

As further shown in FIG. 11, process 1100 may include removing portions of the dielectric layer to form an STI region between the first fin structure and the second fin structure and to form a recess above the STI region (block 1120). For example, one or more of the semiconductor processing tools 102-112 may remove portions of the dielectric layer 322 to form an STI region 206 between the first fin structure and the second fin structure and to form a recess above the STI region, as described above.

As further shown in FIG. 11, process 1100 may include forming, in the recess, a cladding layer over a first sidewall of the first fin structure, over a second sidewall of the second fin structure, and over a top surface of the STI region (block 1130). For example, one or more of the semiconductor processing tools 102-112 may form, in the recess, a cladding layer 324 over a first sidewall of the first fin structure, over a second sidewall of the second fin structure, and over a top surface of the STI region 206, as described above.

As further shown in FIG. 11, process 1100 may include removing the cladding layer from the top surface of the STI region to leave a first cladding sidewall layer along the first sidewall and a second cladding sidewall layer along the second sidewall (block 1140). For example, one or more of the semiconductor processing tools 102-112 may remove the cladding layer 324 from the top surface of the STI region 206 to leave a first cladding sidewall layer 326a along the first sidewall and a second cladding sidewall layer 326b along the second sidewall, as described above. In some implementations, the first cladding sidewall layer and the second cladding sidewall layer include respective lengths that are asymmetric.

Process 1100 may include additional implementations, such as any single implementation or any combination of implementations described below and/or in connection with one or more other processes described elsewhere herein.

In a first implementation, process 1100 includes forming a seed layer 808 over the first sidewall and over the second sidewall prior to forming the cladding layer, and forming the cladding layer 324 on the seed layer 808.

In a second implementation, alone or in combination with the first implementation, forming the seed layer 808 includes forming the seed layer 808 using a chemical vapor deposition process in which a vapor mixture, including disilane ($Si_2H_6$), is used to deposit the seed layer 808.

In a third implementation, alone or in combination with one or more of the first and second implementations, forming the seed layer 808 includes forming the seed layer 808 at a first pressure, and forming the cladding layer at a second pressure. In some implementations, the second pressure is lesser relative to the first pressure.

In a fourth implementation, alone or in combination with one or more of the first through third implementations, forming the seed layer 808 includes forming the seed layer 808 to a thickness 812 in a range from approximately 0.5 nanometers to approximately 1.5 nanometers.

In a fifth implementation, alone or in combination with one or more of the first through fourth implementations, forming the seed layer 808 includes forming the seed layer 808 to a first thickness 812 on sides of a plurality of first layers 304 included in the first fin structure 204a and the second fin structure 204b, and forming the seed layer 808 to a second thickness 812 on sides of a plurality of second layers 306 included in the first fin structure 204a and the second fin structure 204b. In some implementations, the second thickness 812 is lesser relative to the first thickness 812.

In a sixth implementation, alone or in combination with one or more of the first through fifth implementations, process 1100 includes forming a plurality of nanostructures (e.g., the second layers 306) and a plurality of sacrificial nanostructures (e.g., the first layers 304) between the plurality of nanostructures, removing the plurality of sacrificial nanostructures, the first cladding sidewall layer 326a, and the second cladding sidewall layer 326b, and forming, after removing the plurality of sacrificial nanostructures, the first cladding sidewall layer 326a, and the second cladding sidewall layer 326b, a gate structure 212 that wraps around each of the plurality of nanostructures.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

In this way, a cladding sidewall layer footing is removed prior to formation of a hybrid fin structure. Removal of the cladding sidewall layer footing prevents a metal gate footing from forming under the hybrid fin structure when the cladding sidewall layer is removed to enable the metal gate to be formed around the nanostructure channels of a nanostructure transistor. As described herein, cladding sidewall layers can be formed in an asymmetric manner to include different lengths and/or angles, among other examples. The asymmetric cladding sidewall layers enable metal gate structures to be formed for p-type and n-type nanostructure transistors while preventing metal gate footings from forming under hybrid fin structures for p-type and n-type nanostructure transistors. This may reduce a likelihood of short channel effects and leakage within the nanostructure transistors yield of nanostructure transistors formed on a semiconductor substrate.

As described in greater detail above, some implementations described herein provide a method. The method includes forming a dielectric layer between a first fin structure that is above a semiconductor substrate and a second fin structure that is above the semiconductor substrate and is adjacent to the first fin structure. The method includes removing portions of the dielectric layer to form an STI region between the first fin structure and the second fin structure and to form a recess above the STI region. The method includes forming, in the recess, a cladding layer over a first sidewall of the first fin structure, over a second sidewall of the second fin structure, and over a top surface of the STI region. The method includes removing the cladding layer from the top surface of the STI region to leave a first cladding sidewall layer along the first sidewall and a second cladding sidewall layer along the second sidewall. In some implementations, the first cladding sidewall layer and the second cladding sidewall layer include respective lengths that are asymmetric.

As described in greater detail above, some implementations described herein provide a semiconductor device. The semiconductor device includes a first plurality of nanostructures over a semiconductor substrate. The semiconductor device includes a second plurality of nanostructures over the semiconductor substrate. In some implementations, the first and second plurality of nanostructures are arranged along a direction perpendicular to the semiconductor substrate. The semiconductor device includes a first gate structure wrapping around each of the first plurality of nanostructures, including a first sidewall along the direction. The semiconductor device includes a second gate structure wrapping around each of the second plurality of nanostructures, including a second sidewall along the direction. In some implementations, a first bottom edge of the first sidewall is lower relative to a second bottom edge of the second sidewall.

As described in greater detail above, some implementations described herein provide a semiconductor device. The semiconductor device includes a plurality of nanostructures over a semiconductor substrate. In some implementations, the plurality of nanostructures are arranged along a direction perpendicular to the semiconductor substrate. The semiconductor device includes a gate structure wrapping around each of the plurality of nano structures. The gate structure includes a first sidewall along a first side of the plurality of nanostructures. In some implementations, the first sidewall includes a first bottom edge at a first vertical location. The semiconductor device includes a second sidewall along a second side of the plurality of nanostructures opposing the first side. In some implementations, the second sidewall includes a second bottom edge at a second vertical location that is lower relative to the first vertical location of the first bottom edge.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a dielectric layer between a first fin structure that is above a semiconductor substrate and a second fin structure that is above the semiconductor substrate and is adjacent to the first fin structure;
    removing portions of the dielectric layer to form a shallow trench isolation (STI) region between the first fin structure and the second fin structure and to form a recess above the STI region;
    forming, in the recess, a cladding layer over a first sidewall of the first fin structure, over a second sidewall of the second fin structure, and over a top surface of the STI region; and
    removing a portion of the cladding layer from the top surface of the STI region to leave a first cladding sidewall layer along the first sidewall and a second cladding sidewall layer along the second sidewall,
        wherein the first cladding sidewall layer and the second cladding sidewall layer comprise respective lengths that are asymmetric.

2. The method of claim 1, further comprising:
    forming a seed layer over the first sidewall and over the second sidewall prior to forming the cladding layer; and
    wherein forming the cladding layer comprises:
        forming the cladding layer on the seed layer.

3. The method of claim 2, wherein forming the seed layer comprises:
    forming the seed layer using a chemical vapor deposition process in which a vapor mixture, comprising disilane (Si2H6), is used to deposit the seed layer.

4. The method of claim 2, wherein forming the seed layer comprises:
    forming the seed layer at a first pressure; and
    wherein forming the cladding layer comprises:
        forming the cladding layer at a second pressure,
            wherein the second pressure is lesser relative to the first pressure.

5. The method of claim 2, wherein forming the seed layer comprises:
    forming the seed layer to a thickness in a range from approximately 0.5 nanometers to approximately 1.5 nanometers.

6. The method of claim 2, wherein forming the seed layer comprises:
    forming the seed layer to a first thickness on sides of a plurality of first layers included in the first fin structure and the second fin structure; and
    forming the seed layer to a second thickness on sides of a plurality of second layers included in the first fin structure and the second fin structure,
        wherein the second thickness is lesser relative to the first thickness.

7. The method of claim 1, further comprising:
    forming a plurality of nanostructures and a plurality of sacrificial nanostructures between the plurality of nanostructures;
    removing the plurality of sacrificial nanostructures, the first cladding sidewall layer, and the second cladding sidewall layer; and
    forming, after removing the plurality of sacrificial nanostructures, the first cladding sidewall layer, and the second cladding sidewall layer, a gate structure that wraps around each of the plurality of nanostructures.

8. A method, comprising:
    forming a first fin structure having a first width above a semiconductor substrate;
    forming a second fin structure having a second width above the semiconductor substrate;
    depositing a dielectric layer between the first fin structure and the second fin structure;
    etching a portion of the dielectric layer to form a shallow trench isolation (STI) region between the first fin structure and the second fin structure, wherein a top surface of the STI region is sloped or slanted as a result of the etching;

forming, in a recess above of the STI region, a cladding layer over a first sidewall of the first fin structure, over a second sidewall of the second fin structure, and over the top surface of the STI region; and removing a portion of the cladding layer from the top surface of the STI region to leave a first cladding sidewall layer along the first sidewall and a second cladding sidewall layer along the second sidewall.

9. The method of claim 8, wherein a bottom edge of the first cladding sidewall layer is lower than a bottom edge of the second cladding sidewall layer.

10. The method of claim 8, wherein a length of the first cladding sidewall layer is greater than a length of the second cladding sidewall layer.

11. The method of claim 8, wherein the first fin structure is formed to a different height than the second fin structure.

12. The method of claim 8, wherein the first fin structure is a p-type metal oxide semiconductor (PMOS) fin structure, and wherein the second fin structure is a n-type metal oxide semiconductor (NMOS) fin structure.

13. The method of claim 8, further comprising:
forming a third fin structure above the semiconductor substrate; and
forming another STI region between the second fin structure and the third fin structure,
wherein a width of the STI region is different from a width of the other STI region.

14. The method of claim 13, further comprising:
forming a third cladding sidewall on a third sidewall associated with the second fin structure and a fourth cladding sidewall on a fourth sidewall associated with the third fin structure,
wherein a length of the third cladding sidewall is different from a length of the fourth cladding sidewall.

15. A method, comprising:
forming a plurality of fin structures above a semiconductor substrate;
forming a dielectric layer above the semiconductor substrate and in between the plurality of fin structures;
removing portions of the dielectric layer in between the plurality of fin structures to form at least a first shallow trench isolation (STI) region, a first recess above the first STI region, a second STI region, and a second recess above the second STI region,
wherein a height of the first STI region is greater than a height of the second STI region;
forming a cladding layer over sidewalls of the first recess, over sidewalls of the second recess, over a top surface of the first STI region, and over a top surface of the second STI region; and
removing portions of the cladding layer from the top surface of the first STI region and the top surface of the second STI region to leave a first cladding sidewall layer along a first sidewall of the first recess, a second cladding sidewall layer along a second sidewall of the first recess, a third cladding sidewall layer along a first sidewall of the second recess, and a fourth cladding sidewall along a second sidewall of the second recess.

16. The method of claim 15, wherein an angle between the first sidewall of the first recess and a bottom edge of the first cladding sidewall layer is greater than an angle between a first sidewall of the second recess and a bottom edge of the third cladding sidewall layer.

17. The method of claim 15, wherein the first recess has a different width from the second recess.

18. The method of claim 15, wherein the first STI region and the second STI region are asymmetric.

19. The method of claim 15, wherein the first cladding sidewall layer and the second cladding sidewall layer include one or more asymmetric properties.

20. The method of claim 15, wherein a bottom edge of the first cladding sidewall layer is lower than a bottom edge of the second cladding sidewall layer.

* * * * *